United States Patent
Kim et al.

(10) Patent No.: US 12,063,816 B2
(45) Date of Patent: Aug. 13, 2024

(54) DISPLAY DEVICE AND METHOD OF MANUFACTURING THE SAME

(71) Applicant: Samsung Display Co., LTD., Yongin-si (KR)

(72) Inventors: Soo Chul Kim, Yongin-si (KR); Dae Ho Song, Yongin-si (KR); Jin Taek Park, Yongin-si (KR); So Young Yeo, Yongin-si (KR); Ok Yi Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 412 days.

(21) Appl. No.: 17/548,012

(22) Filed: Dec. 10, 2021

(65) Prior Publication Data

US 2022/0352277 A1     Nov. 3, 2022

(30) Foreign Application Priority Data

Apr. 30, 2021   (KR) .................. 10-2021-0056835
Jun. 4, 2021    (KR) .................. 10-2021-0073057

(51) Int. Cl.
   *H01L 27/32*    (2006.01)
   *H10K 50/86*    (2023.01)
   (Continued)

(52) U.S. Cl.
   CPC ...... *H10K 59/1213* (2023.02); *H10K 50/865* (2023.02); *H10K 59/122* (2023.02);
   (Continued)

(58) Field of Classification Search
   CPC ............ H10K 59/1213; H10K 50/865; H10K 59/122; H10K 59/38; H10K 71/00;
   (Continued)

(56) References Cited

U.S. PATENT DOCUMENTS 9,966,553 B2    5/2018  Choi et al.
10,373,985 B2   8/2019  Kim et al.
(Continued)

FOREIGN PATENT DOCUMENTS

JP          6078164        2/2017
KR    10-2017-0117282     10/2017
(Continued)

*Primary Examiner* — Mohammed R Alam
(74) *Attorney, Agent, or Firm* — KILE PARK REED & HOUTTEMAN PLLC

(57) ABSTRACT

A display device includes pixels disposed on a substrate. Each of the pixels include a pixel circuit layer disposed on the substrate and includes at least one transistor, a first electrode disposed on the pixel circuit layer and electrically connected to the at least one transistor, a bank disposed on the first electrode, the bank including an opening exposing the first electrode, a conductive pattern disposed on a side surface of the bank surrounding the opening of the bank and the exposed first electrode, a light-emitting element disposed on the conductive pattern in the opening of the bank and electrically connected to the first electrode, and a second electrode disposed on the light-emitting element. The conductive pattern is a guide member that guides light emitted from the light-emitting element to an upper portion of the second electrode.

27 Claims, 25 Drawing Sheets

(51) Int. Cl.
*H10K 59/121* (2023.01)
*H10K 59/122* (2023.01)
*H10K 59/38* (2023.01)
*H10K 71/00* (2023.01)
*H10K 59/12* (2023.01)

(52) U.S. Cl.
CPC ............. *H10K 59/38* (2023.02); *H10K 71/00* (2023.02); *H10K 59/1201* (2023.02)

(58) Field of Classification Search
CPC ........................ H10K 59/1201; H10K 50/856; H01L 33/507; H01L 33/58; H01L 2933/0058; H01L 2933/0066; H01L 25/167; H01L 33/60; H01L 33/62; H01L 25/0753; H01L 27/124; H01L 27/1259; H01L 27/156
See application file for complete search history.

(56) References Cited

U.S. PATENT DOCUMENTS

| | | | |
|---|---|---|---|
| 10,636,349 | B2 | 4/2020 | Shin et al. |
| 2018/0040644 | A1* | 2/2018 | Ishii ..................... G02F 1/1303 |
| 2018/0190672 | A1* | 7/2018 | Lee ....................... H01L 27/156 |
| 2020/0285090 | A1* | 9/2020 | Tanaka .................. H10K 50/81 |
| 2022/0352247 | A1 | 11/2022 | Song et al. |

FOREIGN PATENT DOCUMENTS

| | | |
|---|---|---|
| KR | 10-2018-0032715 | 4/2018 |
| KR | 10-2018-0118488 | 10/2018 |
| KR | 10-2022-0149883 | 11/2022 |
| WO | 2014/093063 | 6/2014 |

* cited by examiner

170: 170a, 170b

DISPLAY DEVICE AND METHOD OF MANUFACTURING THE SAME

CROSS-REFERENCE TO RELATED APPLICATION(S)

This application claims priority to and benefits of Korean Patent Application No. 10-2021-0056835 under 35 U.S.C § 119 filed on Apr. 30, 2021 in the Korean Intellectual Property Office and Korean Patent Application No. 10-2021-0073057 under 35 U.S.C § 119 filed on Jun. 4, 2021 in the Korean Intellectual Property Office, the entire contents of which are incorporated herein by reference.

BACKGROUND

1. Technical Field

The disclosure relates to a display device and a method of manufacturing the same.

2. Description of the Related Art

With the recent increase of interest in information displays, research and development of display devices has been continuously being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure is directed to providing a display device in which luminance efficiency of a pixel may be improved while simplifying a manufacturing process, and a method of manufacturing the same.

A display device may include pixels disposed on a substrate. Each of the pixels may include a pixel circuit layer disposed on the substrate and may include at least one transistor; a first electrode disposed on the pixel circuit layer and electrically connected to the at least one transistor; a bank disposed on the first electrode, the bank including an opening exposing the first electrode; a conductive pattern disposed on a side surface of the bank surrounding the opening of the bank and the exposed first electrode; a light-emitting element disposed on the conductive pattern in the opening of the bank and electrically connected to the first electrode; and a second electrode disposed on the light-emitting element. The conductive pattern may be a guide member that guides light emitted from the light-emitting element to an upper portion of the second electrode.

In an embodiment, the light-emitting element may include a first end portion and a second end portion in a length direction of the light-emitting element. The first end portion may contact and may be electrically connected to the conductive pattern, and the second end portion may contact and may be electrically connected to the second electrode.

In an embodiment, the light-emitting element may include a bonding electrode disposed at the first end portion of the light-emitting element, the bonding electrode contacting and electrically connected to the conductive pattern; a third semiconductor layer disposed at the second end portion of the light-emitting element, with the third semiconductor layer contacting and electrically connected to the second electrode; a second semiconductor layer disposed on the bonding electrode; a first semiconductor layer disposed between the third semiconductor layer and the second semiconductor layer; and an active layer disposed between the first semiconductor layer and the second semiconductor layer.

In an embodiment, the first semiconductor layer may be an n-type semiconductor layer doped with an n-type dopant, and the second semiconductor layer may be a p-type semiconductor layer doped with a p-type dopant.

In an embodiment, the conductive pattern may be bonded to the bonding electrode of the light-emitting element.

In an embodiment, the conductive pattern may include a first layer disposed on the first electrode and a second layer disposed on the first layer. The first layer may directly contact the first electrode, and the second layer may directly contact the bonding electrode.

In an embodiment, each of the first layer the and the second layer may include a metal that reflects a light emitted from the light-emitting element. The first layer may include at least one metal selected from gold and tin, and the second layer may include at least one metal selected from titanium, copper, and nickel. The first layer and the second layer may have different thicknesses.

In an embodiment, an area of the conductive pattern disposed on the side surface of the bank may have a gradient corresponding to an inclination angle of the side surface of the bank.

In an embodiment, the area of the conductive pattern may include a protrusion protruding toward the second electrode.

In an embodiment, each of the pixels may include an intermediate layer disposed between the bank and the second electrode in the opening of the bank. The intermediate layer may be a fixing member fixing the light-emitting element. the intermediate layer may include an organic material that has adhesiveness and is cured by heat or light.

In an embodiment, each of the pixels may include an emission area including the light-emitting element and a non-emission area adjacent to the emission area. The bank may correspond to the non-emission area, and the opening of the bank may correspond to the emission area.

In an embodiment, each of the pixels may include a cover layer entirely disposed on the second electrode; and an upper substrate disposed on the cover layer.

In an embodiment, the upper substrate may include a base layer disposed on the cover layer including a surface facing the light-emitting element; a light conversion pattern disposed on the surface of the base layer to correspond to the emission area; and a light blocking pattern disposed on the surface of the base layer to correspond to the non-emission area.

In an embodiment, the light conversion pattern may include a color filter disposed on the surface of the base layer; and a color conversion layer disposed on the color filter with an insulating layer disposed between the color conversion layer and the color filter to correspond to the light-emitting element, the color conversion layer may include color conversion particles.

In an embodiment, the light blocking pattern may include a first light blocking pattern disposed on the surface of the base layer, and a second light blocking pattern disposed on the insulating layer to correspond to the first light blocking pattern.

In an embodiment, the upper substrate may include a capping layer entirely disposed on the color conversion layer and the second light blocking pattern.

In an embodiment, the opening of the bank may have a width greater than a width of the first electrode.

In an embodiment, the pixel circuit layer may include a passivation layer disposed on the at least one transistor. The opening of the bank may entirely expose the first electrode and may partially expose the passivation layer.

In an embodiment, the conductive pattern may be disposed on the exposed first electrode and the exposed portion of the passivation layer.

In an embodiment, the first electrode may include a groove stepped from a surface of the first electrode toward the pixel circuit layer. The groove may correspond to the opening of the bank.

In an embodiment, the conductive pattern may include a third layer disposed on the exposed first electrode and the side surface of the bank; a first layer disposed on the third layer; and a second layer disposed between the first layer and the light-emitting element. The third layer may directly contact the first electrode, and the second layer may directly contact the light-emitting element.

In an embodiment, the third layer may include at least one metal selected from titanium, copper, and nickel, the first layer may include aluminum, and the second layer may include at least one metal selected from gold and tin.

In an embodiment, the first layer may be disposed on an uppermost layer on the side surface of the bank.

A display device may include pixels disposed on a substrate. Each of the pixels may include a pixel circuit layer disposed on the substrate, the pixel circuit layer may include at least one transistor; a first electrode disposed on the pixel circuit layer and electrically connected to the at least one transistor; a bank disposed on the first electrode, the bank may include an opening exposing the first electrode; a conductive pattern disposed on a side surface of the bank surrounding the opening and the exposed first electrode; a light-emitting element disposed on the conductive pattern in the opening and electrically connected to the first electrode; and a second electrode disposed on the light-emitting element.

In an embodiment, the conductive pattern may include a third layer disposed on the first electrode, a first layer disposed on the third layer, and a second layer disposed on the first layer on the first electrode.

In an embodiment, the conductive pattern may be a guide member that guides light emitted from the light-emitting element to an upper portion of the second electrode.

In an embodiment, the second layer may be a bonding member bonded to the light-emitting element.

The above-described display device may be manufactured through a method of manufacturing a display device, the method may include forming at least one transistor on a substrate; forming a first electrode electrically connected to the at least one transistor; applying an insulating material layer and a photosensitive material layer on the first electrode and removing the photosensitive material layer on an area of the first electrode to form a photosensitive pattern exposing the insulating material layer; removing the exposed insulating material layer using the photosensitive pattern as an etching mask to form a bank which may include an opening exposing the area of the first electrode; forming a conductive layer entirely on the photosensitive pattern and the exposed area of the first electrode; removing the photosensitive pattern and the conductive layer disposed on the photosensitive pattern through a lift-off to form a conductive pattern on the area of the first electrode; applying, entirely, an intermediate layer material having fluidity on the conductive pattern and the bank; disposing a transfer substrate, onto which at least one light-emitting element is transferred, on the substrate, bonding the light-emitting element and the conductive pattern, curing the intermediate layer material to form an intermediate layer, and then removing the transfer substrate; and forming a second electrode on the light-emitting element and the intermediate layer.

In an embodiment, the conductive pattern may be a guide member that guides light emitted from the light-emitting element to an upper portion of the second electrode.

In an embodiment, the light-emitting element may include a bonding electrode that contacts the conductive pattern and is electrically connected to the conductive pattern; a third semiconductor layer that contacts the second electrode and is electrically connected to the second electrode; a second semiconductor layer disposed on the bonding electrode; a first semiconductor layer disposed between the third semiconductor layer and the second semiconductor layer; and an active layer disposed between the first semiconductor layer and the second semiconductor layer, the first semiconductor layer may be an n-type semiconductor layer doped with an n-type dopant, and the second semiconductor layer may be a p-type semiconductor layer doped with a p-type dopant.

In an embodiment, the conductive pattern may include a first layer disposed on the first electrode and a second layer disposed on the first layer, the first layer directly contacts the first electrode, and the second layer directly contacts the bonding electrode.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
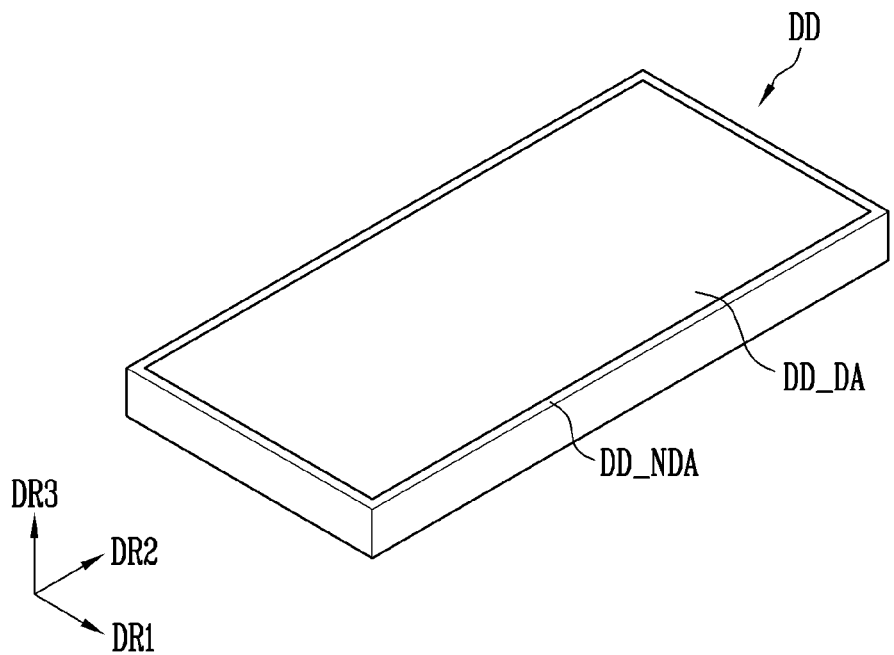
FIG. 1 is a schematic perspective view illustrating a display device in accordance with an embodiment.

While the disclosure is open to various modifications and alternative embodiments, embodiments thereof will be described and illustrated by way of example in the accompanying drawings. However, it should be understood that there is no intention to limit the disclosure to the embodiments disclosed, and, on the contrary, the disclosure is intended to cover all modifications, equivalents, and alternatives falling within the spirit and scope of the disclosure.

Like numbers refer to like elements throughout the drawings. In the accompanying drawings, the sizes of structures may be exaggerated for clarity.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Although the terms "first", "second", and the like are used herein to describe various elements, these elements should not be limited by these terms. The terms are used only for the purpose of distinguishing one element from another element. For example, without departing from the spirit and scope of the disclosure, a first element could be termed a second element, and similarly a second element could be also termed a first element.

It will be understood that the terms "comprises" and/or "comprising," or "includes" and/or "including," "have" and/or "having" and variations thereof when used in this specification, specify the presence of stated features, integers, steps, operations, elements, components, and/or combinations thereof but do not preclude the presence or addition of one or more other features, integers, steps, operations, elements, components, and/or combinations thereof.

In addition, when a layer, a film, an area, or a plate is referred to as being "on" or "under" or "below" another layer, another film, another area, or another plate, it can be "directly" or "indirectly" on the other layer, film, area, plate, or one or more intervening layers may also be present. Further, in the disclosure, when a part of a layer, a film, an area, a plate, and the like is formed on another part, a direction, in which the part is formed, is not limited only to an up direction, and includes a lateral direction or a down direction. On the contrary, it will be understood that when an element such as a layer, film, area, or plate is referred to as being "beneath" another element, it can be directly beneath the other element or intervening elements may also be present.

For example, the spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

In the application, it will be understood that, when an element (for example, a first element) is "(operatively or communicatively) coupled with/to" or "connected to" another element (for example, a second element), the element may be directly coupled with/to another element, and there may be an intervening element (for example, a third element or other elements) between the element and another element. In addition, the term "connecting" or "coupling" may comprehensively refer to physical and/or electrical connecting or coupling.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments and other subject matters necessary for those skilled in the art to readily understand the contents of the disclosure will be described in detail with reference to the accompanying drawings.

In the following description, the singular forms "a," "an," and "the" are intended to include the plural forms as well, unless the context clearly indicates otherwise.

Figure 2:
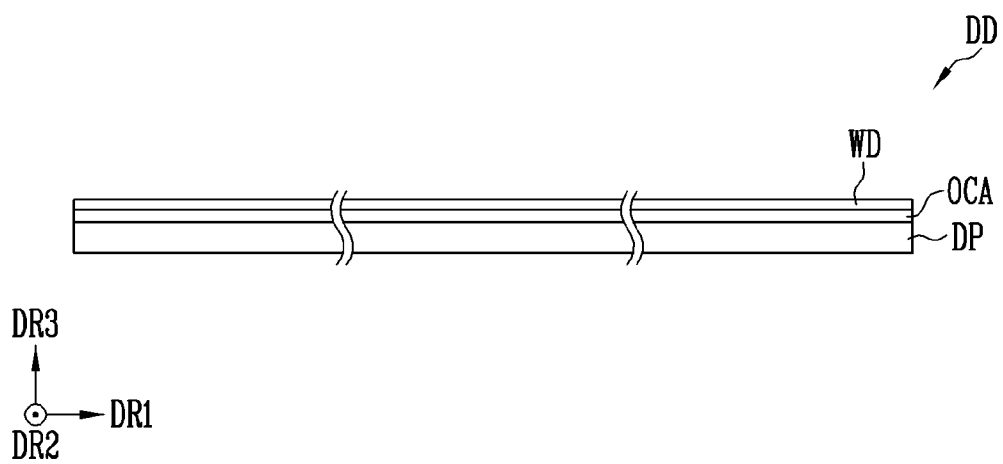
FIG. 2 is a schematic cross-sectional view illustrating the display device of FIG. 1.
Figure 3:
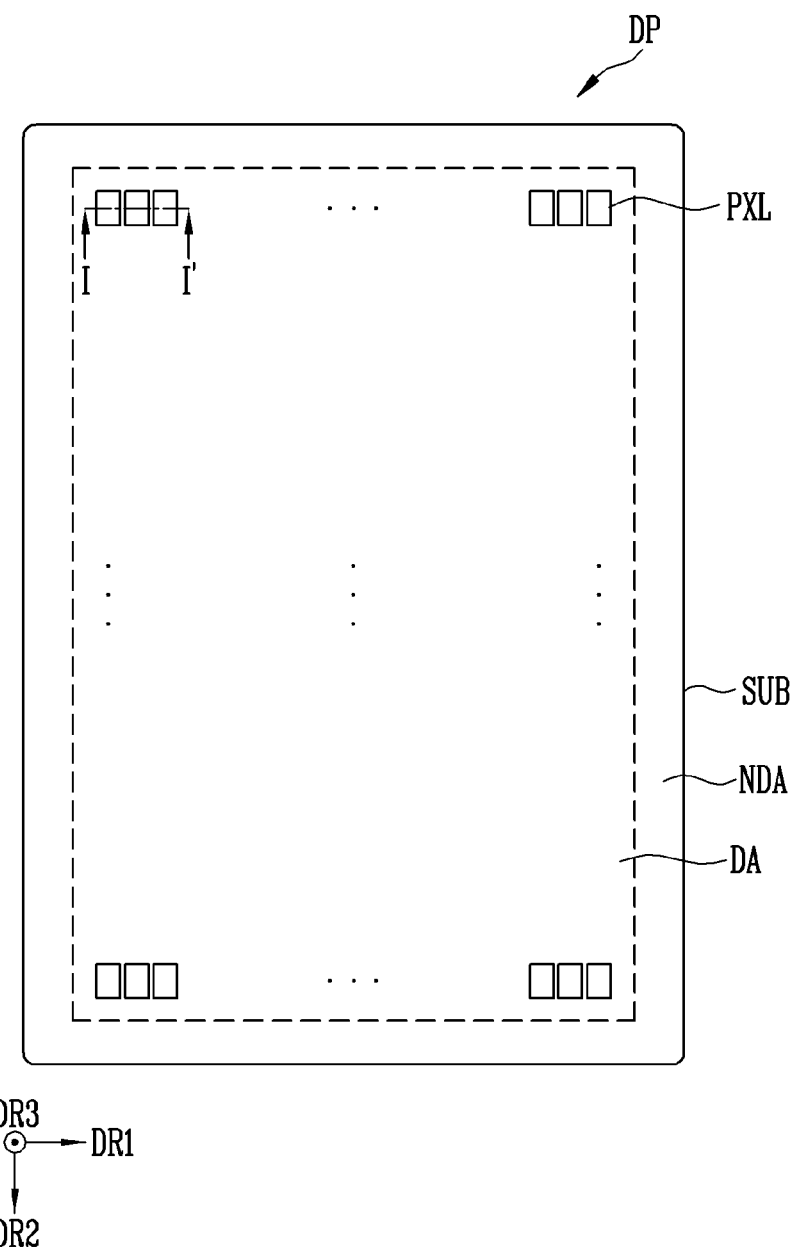
FIG. 3 is a schematic plan view illustrating a display panel in accordance with an embodiment.
Figure 4:
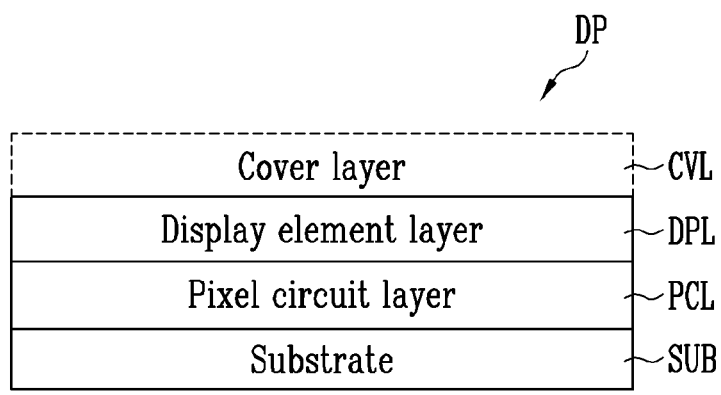
FIGS. 4 and 5 are schematic cross-sectional views illustrating the display panel in accordance with an embodiment.
Figure 5:
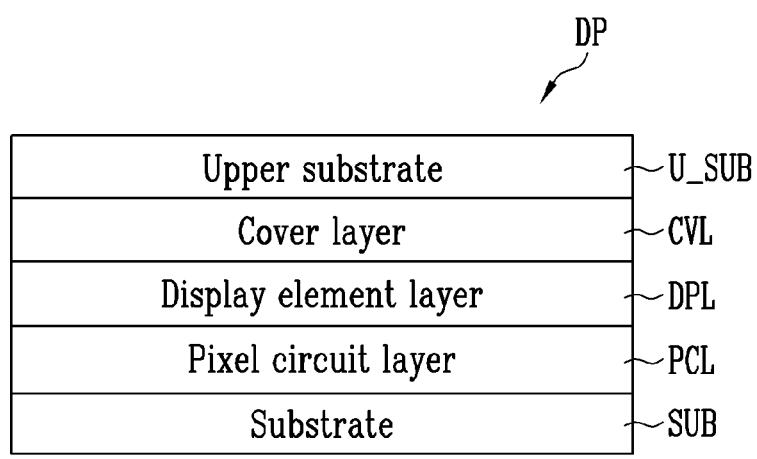

FIG. 1 is a schematic perspective view illustrating a display device DD in accordance with an embodiment, and FIG. 2 is a schematic cross-sectional view illustrating the display device DD of FIG. 1. FIG. 3 is a schematic plan view illustrating a display panel DP in accordance with an embodiment, and FIGS. 4 and 5 are schematic cross-sectional views illustrating the display panel DP according to an embodiment.

Referring to FIGS. 1 to 5, the display device DD may include the display panel DP and a window WD.

The display device DD may be provided in various shapes, and for example, may be provided in a substantially rectangular plate shape having two pairs of sides parallel to each other, but the disclosure is not limited thereto. In case that the display device DD is provided in a substantially rectangular plate shape, among two pairs of sides, one pair of sides may be provided longer than the other pair of sides. Although the display device DD is illustrated as having an angled corner portion composed of straight lines, the disclosure is not limited thereto. According to embodiments, the display device DD provided in the substantially rectangular plate shape may have a substantially round shaped-corner portion at which where one long side and one short side or a short side are in contact with each other.

For convenience of description, FIG. 1 illustrates a case in which the display device DD has a substantially rectangular shape having one pair of long sides and one pair of short sides. An extending direction of the long side is expressed as a second direction DR2, an extending direction of the short side is expressed as a first direction DR1, and a direction perpendicular to the extending directions of the long side and the short side is expressed as a third direction DR3. The first to third directions DR1, DR2, and DR3 may refer to directions indicated by the first to third directions DR1, DR2, and DR3, respectively.

In an embodiment, at least a portion of the display device DD may have flexibility, and the display device DD may be folded at the portion having flexibility. The display device DD may include a display area DD_DA for displaying an image and a non-display area DD NDA provided on least one side or a side of the display area DD_DA. The non-display area DD NDA is an area in which an image is not displayed. According to embodiments, a shape of the display area DD_DA and a shape of the non-display area DD NDA may be relatively designed.

According to embodiments, the display device DD may include a sensing area and a non-sensing area. The display device DD may not only display an image through the sensing area but may also sense a touch input performed on a display surface (or input surface) or detect light incident from the front. The non-sensing area may surround the sensing area, but this is merely an example, and the disclosure not limited thereto. According to embodiments, a partial area of the display area DD_DA may correspond to the sensing area.

The display panel DP may display an image. A display panel capable of self-emitting light, such as an organic light-emitting diode display panel (OLED display panel) using an OLED as a light-emitting element, and a nano-scale light-emitting diode (LED) display panel using a nano-LED as a light-emitting element, or a quantum dot OLED display panel (QD OLED panel) using quantum dots and an OLED may be used as the display panel DP. A non-emissive display panel such as a liquid crystal display panel (LCD panel), an electrophoretic display panel (EPD panel), or an electro-wetting display panel (EWD panel may be used as the display panel DP. In case that the non-emissive display panel is used as the display panel DP, the display device DD may include a backlight unit that supplies light to the display panel DP.

The display panel DP may include a substrate SUB and pixels PXL provided on (or disposed on) the substrate SUB.

The substrate SUB may be formed as one area or an area having an approximately rectangular shape. However, the number of areas provided on the substrate SUB may be different from the above-described example, and the substrate SUB may have different shapes according to the areas provided on the substrate SUB.

The substrate SUB may be made of an insulating material such as glass or a resin. The substrate SUB may be made of a material having flexibility so as to be bendable or foldable and may have a single layer structure or a multi-layer structure. For example, the material having flexibility may include at least one selected from polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB is not limited to the above-described embodiments.

The substrate SUB may include a display area DA and a non-display area NDA. The display area DA may be an area in which the pixels PXL are provided to display an image, and the non-display area NDA may be an area in which the pixels PXL are not provided and thus an image is not displayed.

The display area DA of the substrate SUB (or the display panel DP) may correspond to the display area DD_DA of the display device DD, and the non-display area NDA of the substrate SUB (or the display panel DP) may correspond to the non-display area DD NDA of the display device DD. The non-display area NDA may correspond to a bezel area of the display device DD.

The non-display area NDA may be provided on at least one side or a side of the display area DA. The non-display area NDA may surround a circumference (or an edge) of the display area DA or may be adjacent to the display area DA. Portions of a line or line unit connected to the pixels PXL and a driver connected to the line unit to drive the pixels PXL may be provided in the non-display area NDA.

The line unit may electrically connect the driver and the pixels PXL. The portions of the line unit may be signal lines which provide signals to the pixels PXL and are connected to the pixels PXL, for example, fan-out lines connected to scan lines, data lines, and the like within the spirit and the scope of the disclosure.

The pixels PXL may be provided in the display area DA of the substrate SUB. Each of the pixels PXL may be a minimum unit for displaying an image. The pixels PXL may include light-emitting elements emitting white light and/or color light. Although each of the pixels PXL may emit any one color of a red color, a green color, and a blue color, the disclosure is not limited thereto, and each of the pixels PXL may emit a color such as a cyan color, a magenta color, or a yellow color.

The pixels PXL may be arranged or disposed in a matrix form along rows extending in a first direction DR1 and columns extending in a second direction DR2 intersecting the first direction DR1. However, the arrangement form of the pixels PXL is not particularly limited, and the pixels PXL may be arranged or disposed in various forms. Although the pixels PXL are illustrated in the drawing as having a substantially rectangular shape, the disclosure is not limited thereto, and the pixels PXL may be modified into various shapes. Also, in case that the pixels PXL are provided, the pixels PXL may be provided to have different areas (or sizes). For example, in case that the pixels PXL emit different colors of light, the pixels PXL may be provided have different areas (or sizes) or different shapes according to the different colors.

The driver may control driving of the pixel PXL by providing a signal and a power to each pixel PXL through the line unit.

As illustrated in FIG. 4, the display panel DP may include a pixel circuit layer PCL, a display element layer DPL, and a cover layer CVL which may be sequentially disposed on the substrate SUB.

The pixel circuit layer PCL may be provided on the substrate SUB and may include transistors and signal lines connected to the transistors. For example, each transistor may have a form in which a semiconductor layer, a gate electrode, a first terminal, and a second terminal may be sequentially stacked each other with an insulating layer interposed therebetween. The semiconductor layer may include at least one selected from amorphous silicon, poly silicon, low temperature poly silicon, and an organic semiconductor. The gate electrode, the first terminal, and the second terminal may include at least one selected from aluminum (Al), copper (Cu), titanium (Ti), and molybdenum (Mo), but the disclosure is not limited thereto. The pixel circuit layer PCL may include one or more insulating layers.

The display element layer DPL may be disposed on the pixel circuit layer PCL The display element layer DPL may include the light-emitting elements emitting light. The light-emitting element may be, for example, an OLED or an inorganic light-emitting element including an inorganic light-emitting material, or a light-emitting element emitting light by changing a wavelength of light emitted using quantum dots.

The cover layer CVL may be disposed on the display element layer DPL. The cover layer CVL may be in the form of an encapsulation substrate or an encapsulation film formed as a multi-layer film. In case that the cover layer CVL is in the form of the encapsulation film, the cover layer CVL may include an inorganic film and/or an organic film. For example, the cover layer CVL may have a form in which an inorganic film, an organic film, and an inorganic film may be sequentially stacked each other. The cover layer CVL may prevent external air and moisture from permeating into the display element layer DPL and the pixel circuit layer PCL.

According to embodiments, as illustrated in FIG. 5, an upper substrate U_SUB may be disposed on the cover layer CVL. The upper substrate U_SUB may use quantum dots to change a wavelength (or a color) of light emitted from the display element layer DPL and may include a light conversion pattern (layer) which uses a color filter to transmit light having a specific or given wavelength (or a specific or given color). The upper substrate U_SUB may be formed on the substrate SUB, on which the display element layer DPL is provided, through an adhesion process using an adhesive layer. The upper substrate U_SUB will be described below with reference to FIGS. 11 and 12.

Although it has been described that the light conversion pattern is provided separately from the display element layer DPL, the disclosure is not limited thereto. For example, the light-emitting element provided on the display element layer DPL may be implemented as a light-emitting element that emits light by changing a wavelength of light emitted using quantum dots.

The window WD for protecting an exposed surface of the display panel DP may be provided on the display panel DP. The window WD may protect the display panel DP from an external impact and may provide an input surface and/or a display surface to a user. The window WD may be connected or coupled to the display panel DP using an optically transparent adhesive (or adhesive) member OCA.

The window WD may have a multi-layer structure selected from a glass substrate, a plastic film, or a plastic substrate. Such a multi-layer structure may be formed through a continuous process or an adhesion process using an adhesive layer. An entirety or portion of the window WD may have flexibility.

A touch sensor (or an input sensing layer) may be disposed between the display panel DP and the window WD. The touch sensor may be disposed on or directly disposed on a surface of the display panel DP, from which an image is emitted, to receive a touch input of a user.

Figure 6:
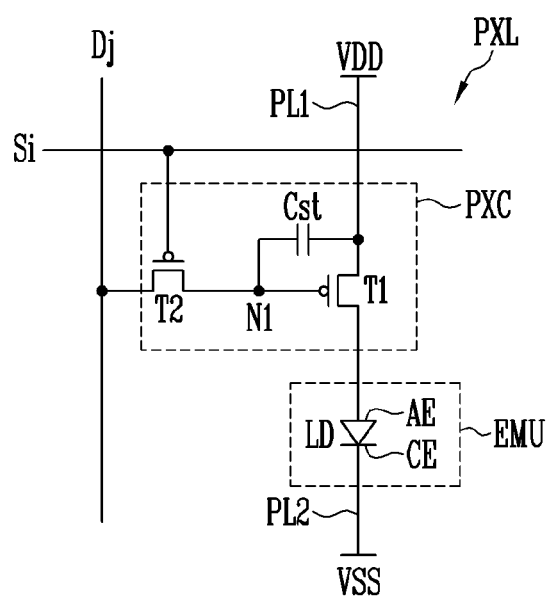
FIG. 6 is a schematic diagram of an equivalent circuit of an electrical connection relationship between components included in each pixel illustrated in FIG. 3 according to an embodiment.

FIG. 6 is a schematic diagram of an equivalent circuit illustrating an electrical connection relationship between components included in each pixel PXL illustrated in FIG. 3 according to an embodiment.

For example, FIG. 6 illustrates an electrical connection relationship between components included in a pixel PXL applicable to an active matrix type display device according to an embodiment. However, types of components included in the pixel PXL applicable to embodiments are not limited thereto.

In FIG. 6, not only the components included in the pixel PXL illustrated in FIG. 3 but also an area in which the components are provided is referred to as the pixel PXL. The pixel PXL illustrated in FIG. 6 may be any one of the pixels PXL included in the display panel DP of FIG. 3 (or the display device DD of FIG. 1), and the pixels PXL may have substantially the same or similar structures.

Referring to FIGS. 1 to 6, the pixel PXL may include a light-emitting unit EMU (or an emission unit) which generates light having luminance corresponding to a data signal. The pixel PXL may further include a pixel circuit PXC for driving the light-emitting unit EMU.

According to embodiments, the light-emitting unit EMU may include light-emitting elements LD connected between a first power line PL1 to which a voltage of a first driving power source VDD is applied and a second power line PL2 to which a voltage of a second driving power source VSS is applied. As an example, the light-emitting unit EMU may include the light-emitting element LD connected between a first electrode AE (or a pixel electrode) and a second electrode CE. In an embodiment, the first electrode AE may be an anode, and the second electrode CE may be a cathode.

The light-emitting element LD included in the light-emitting unit EMU may include a first end portion connected to the first driving power source VDD through the first electrode AE and a second end portion connected to the second driving power source VSS through the second electrode CE. The first driving power source VDD and the second driving power source VSS may have different potentials. As an example, the first driving power source VDD may be set as a high potential power source, and the second driving power source VSS may be set as a low potential power source. A potential difference between the first driving power source VDD and the second driving power source VSS may be set to be greater than or equal to a threshold voltage of the light-emitting element LD during an emission period of the pixel PXL.

As described above, the light-emitting element LD connected between the first electrode AE and the second electrode CE to which voltages having different potentials are supplied may constitute an effective light source and implement the light-emitting unit EMU of each pixel PXL.

The light-emitting element LD may emit light at luminance corresponding to a driving current supplied through the pixel circuit PXC. For example, during each frame period, the pixel circuit PXC may supply a driving current corresponding to a gradation value of corresponding frame data to the light-emitting unit EMU. The driving current supplied to the light-emitting unit EMU may flow in the light-emitting element LD. Accordingly, while the light-emitting element LD emits light at luminance corresponding to the driving current, the light-emitting unit EMU may emit the light.

The pixel circuit PXC may be connected to a scan line Si and a data line Dj of the pixel PXL. As an example, in case that it is assumed that the pixel PXL is disposed in an $i^{th}$ row and a $j^{th}$ column in a display area DA of a display panel DP (or a substrate SUB) (wherein i is a natural number and j is a natural number), the pixel circuit PXC of the pixel PXL may be connected to an $i^{th}$ scan line Si and a $j^{th}$ data line Dj in the display area DA. According to embodiments, the pixel circuit PXC may include first and second transistors T1 and T2 and a storage capacitor Cst. However, the structure of the pixel circuit PXC is not limited to the embodiment illustrated in FIG. 6.

The first transistor T1 may be a driving transistor for controlling a driving current applied to the light-emitting unit EMU and may be connected between the light-emitting unit EMU and the first driving power source VDD. By way of example, a first terminal of the first transistor T1 may be connected (or coupled) to the light-emitting unit EMU, a second terminal of the first transistor T1 may be connected to the second driving power line VDD through a first power line PL1, and a gate electrode of the first transistor T1 may be connected (or coupled) to a first node N1. The first transistor T1 may control an amount of a driving current flowing to the light-emitting unit EMU from the first driving power source VDD according to a voltage applied to the first node N1.

The second transistor T2 may be a switching transistor which selects the pixel PXL in response to a scan signal applied to the scan line Si and activates the pixel PXL and may be connected between the data line Dj and the first node N1. A first terminal of the second transistor T2 may be connected (or coupled) to the data line Dj, a second terminal of the second transistor T2 may be connected (or coupled) to the first node N1, and a gate electrode of the second transistor T2 may be connected (or coupled) to the scan line Si. The first terminal and the second terminal of the second transistor T2 may be different terminals, and for example, in case that the first terminal is a source electrode, the second terminal may be a drain electrode.

In case that a scan signal having a voltage (for example, a low voltage), at which the second transistor T2 is turned on, is supplied from the scan line Si, the second transistor T2 is turned on to electrically connects the data line Dj and the first node N1. A data signal of a corresponding frame is supplied to the data line Dj, and thus, the data signal is transmitted to the first node N1. The data signal transmitted to the first node N1 is charged in the storage capacitor Cst.

One electrode of the storage capacitor Cst may be connected (coupled) to the first driving power source VDD, and the other electrode thereof may be connected (coupled) to the first node N1. The storage capacitor Cst may be charged with a data voltage corresponding to a data signal supplied to the first node N1 and may maintain the charged voltage until a data signal of a next frame is supplied.

FIG. 6 illustrates the pixel circuit PXC including the second transistor T2 for transmitting a data signal into the pixel PXL, the storage capacitor Cst for storing the data signal, and the first transistor T1 for supplying a driving current corresponding to the data signal to the light-emitting element LD.

However, the disclosure is not limited thereto, and the structure of the pixel circuit PXC may be variously changed.

Figure 7:
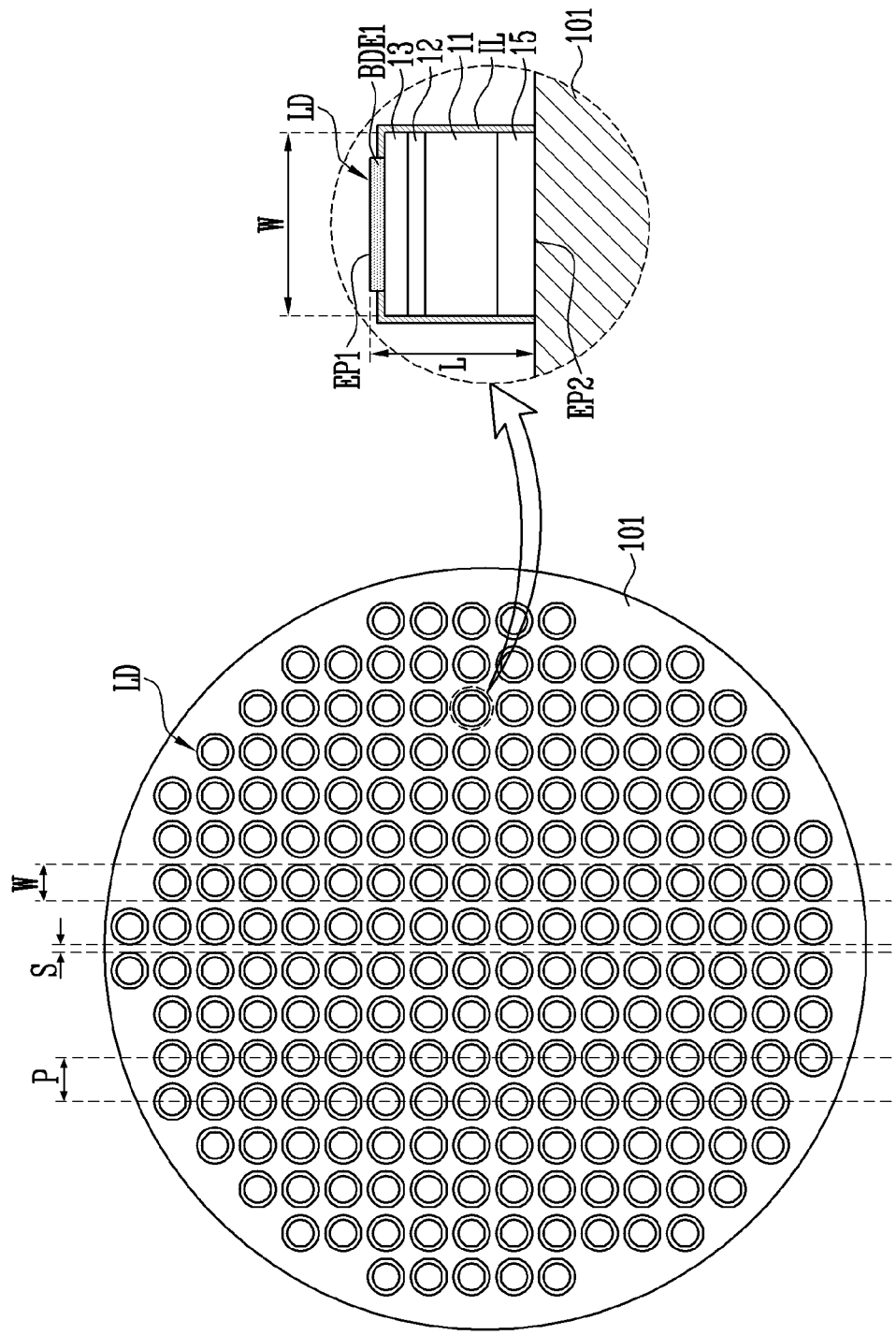
FIG. 7 shows schematic views illustrating light-emitting elements grown on a growth substrate.

FIG. 7 shows schematic views illustrating light-emitting elements LD grown on a growth substrate 101.

Referring to FIGS. 1 to 7, each light-emitting element LD may be manufactured and positioned on the growth substrate 101.

The growth substrate 101 may be formed as a conductive substrate or an insulating substrate. For example, the growth substrate 101 may be made of at least one selected from sapphire SiC, silicon (Si), GaAs, GaN, ZnO, GaP, InP, germanium (Ge), and $Ga_2O_3$, but the disclosure is not limited thereto.

Each light-emitting element LD may emit light as electrons and holes are recombined according to a current flowing between a first end portion EP1 and a second end portion EP2. By using such a principle, each light-emitting element LD may be used as a light source (or a light source) of various light-emitting devices including the pixel PXL.

Each light-emitting element LD may include a first semiconductor layer 11, a second semiconductor layer 13, and an active layer 12 interposed between the first semiconductor layer 11 and the second semiconductor layer 13. According to embodiments, the light-emitting element LD may further include a third semiconductor layer 15. The third semiconductor layer 15 may be positioned on the first semiconductor layer 11. Each light-emitting element LD may implement a vertical light-emitting stack in which the third semiconductor layer 15, the first semiconductor layer 11, the active layer 12, and the second semiconductor layer 13 may be sequentially stacked each other on the growth substrate 101.

The light-emitting element LD may be provided in a shape extending in one direction or a direction. In case that it is assumed that an extending direction of the light-emitting element LD is a length direction, the light-emitting element LD may include the first end portion EP1 and the second end portion EP2 in the length direction. In an embodiment, the length direction may be parallel to a thickness direction of the growth substrate 101. A bonding electrode BDE1 (or a first bonding electrode) disposed on the second semiconductor layer 13 may be positioned at the first end portion EP1 of the light-emitting element LD, and the third semiconductor layer 15 may be positioned at the second end portion EP2 of the light-emitting element LD. However, the disclosure is not limited thereto, and in case that the third semiconductor layer 15 is omitted, the first semiconductor layer 11 may be positioned at the second end portion EP2 of the light-emitting element LD.

The light-emitting element LD may include, for example, an LED manufactured to have a diameter and/or a length L ranging from a nanoscale to a microscale. In an embodiment, the light-emitting element LD may have a width of about 5 μm and a length L of about 5.5 μm, but the disclosure is not limited thereto. The size of the light-emitting element LD may be variously changed to meet the requirements (or design conditions) of a lighting device and a self-luminous display device to which each light-emitting element LD is applied.

The third semiconductor layer 15 may be a layer stacked on the growth substrate 101 and may include a gallium nitride (GaN) semiconductor material doped with impurities at a low concentration. The third semiconductor layer 15 may be provided to protect the active layer 12 from light caused by laser lift-off in a process of manufacturing the light-emitting element LD, for example, a vertical light-emitting element LD, but the disclosure is not limited thereto. The third semiconductor layer 15 may be provided. As an example, the third semiconductor layer 15 may remain on the growth substrate 101 in case that the light-emitting elements LD are separated from the growth substrate 101. According to embodiments, the third semiconductor layer 15 and the first semiconductor layer 11 may be integral with each other. The third semiconductor layer 15 may be an n-type semiconductor layer.

The first semiconductor layer 11 may include, for example, at least one n-type semiconductor layer. For example, the first semiconductor layer 11 may be an n-type semiconductor layer which may include any one semiconductor material selected from InAlGaN, GaN, AlGaN, InGaN, AlN, and InN and is doped with a first conductivity-type dopant (or an n-type dopant) such as Si, Ge, or tin (Sn). However, the material constituting the first semiconductor layer 11 is not limited thereto, and the first semiconductor layer 11 may be made of various materials. In an embodiment, the first semiconductor layer 11 may include a gallium nitride (GaN) semiconductor material doped with the first conductivity-type dopant (or the n-type dopant). According to embodiments, the first semiconductor layer 11 and the third semiconductor layer 15 may constitute an n-type semiconductor layer of each of the light-emitting elements LD.

FIG. 7 illustrates that an outer peripheral surface of the first semiconductor layer 11 is positioned on a same line as an outer peripheral surface of each of the active layer 11 and the second semiconductor layer 13 for convenience, but the disclosure is not limited thereto. According to embodiments, the outer peripheral surface of the first semiconductor layer 11 may be provided in a form extending outward from the outer peripheral surface of each of the active layer 11 and the second semiconductor layer 13. The first semiconductor layer 11 of one light-emitting element LD may be connected to the first semiconductor layer 11 of another light-emitting element LD.

The active layer 12 may be disposed on the first semiconductor layer 11 and may be an area in which electrons and holes are recombined. As electrons and holes are recombined in the active layer 12 to transition to a lower energy level, light having a wavelength corresponding thereto may be generated. The active layer 12 may be made of, for example, a semiconductor material having an empirical formula of $In_xAl_yGa_{1-x-y}N$ ($0 \leq x \leq 1$, $0 \leq y \leq 1$, and $0 \leq x+y \leq 1$) and may be formed in single or multi-quantum well structure. As an example, in case that the active layer 12 is formed to have a multi-quantum well structure, in the active layer 12, a barrier layer, a strain reinforcing layer, and a well layer may be repeatedly and periodically stacked each other as one unit. However, the structure of the active layer 12 is not limited to the above-described embodiment. The active layer 12 may have a first surface in contact with the first semiconductor layer 11 and a second surface in contact with the second semiconductor layer 13.

The second semiconductor layer 13 is disposed on the second surface of the active layer 12 and provides holes to the active layer 12. The second semiconductor layer 13 may include a semiconductor layer which is a different type from the first semiconductor layer 11. As an example, the second semiconductor layer 13 may include at least one p-type semiconductor layer. For example, the second semiconductor layer 13 may include a p-type semiconductor layer which may include at least one semiconductor material selected from InAlGaN, GaN, AlGaN, InGaN, AlN, and InN and is doped with a second conductive type dopant (or a p-type dopant) such as magnesium (Mg), zinc (Zn), calcium (Ca), strontium (Sr) or barium (Ba). However, the material constituting the second semiconductor layer 13 is not limited thereto, and the second semiconductor layer 13 may be made of various materials. In an embodiment, the second semiconductor layer 13 may include a gallium nitride (GaN) semiconductor material doped with the second conductivity-type dopant (or the p-type dopant).

Each light-emitting element LD may include the bonding electrode BDE1 (or the first bonding electrode) disposed on the second semiconductor layer 13. The bonding electrode BDE1 may be bonded to a first electrode AE of a light-emitting unit EMU. According to embodiments, each light-emitting element LD may include a separate contact electrode in ohmic contact with the second semiconductor layer 13 between the second semiconductor layer 13 and the bonding electrode BDE1.

Each light-emitting element LD may further include an insulating film IL. However, according to embodiments, the insulating film IL may be omitted or provided to cover or overlap only a portion of the light-emitting stack.

The insulating film IL may include a transparent insulating material. For example, the insulating film IL may include at least one insulating material selected from the group consisting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanium strontium oxide ($SrTiO_x$), cobalt oxide ($Co_xO_y$), magnesium oxide (MgO), zinc oxide (ZnO), ruthenium oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, $InxO_y$:H, niobium oxide ($NbxO_y$), magnesium fluoride ($MgF_x$), aluminum fluoride ($AlF_x$), an alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), and vanadium nitride (VN). However, the disclosure is not limited thereto, and various materials having insulating properties may be used as the material of the insulating film IL.

The insulating film IL may be provided in the form of a single layer (or a single film) or may be provided in the form of a multi-layer (or multi-film) including a double-layer. For example, in case that the insulating film IL is formed as a double-layer including a first insulating layer and a second insulating layer sequentially stacked each other, the first insulating layer and the second insulating layer are made of different materials (substances) and may be formed through different processes. According to embodiments, the first insulating layer and the second insulating layer may include the same material or a similar material and may be formed through a continuous process.

The insulating film IL may prevent an electrical short circuit that may occur in case that the active layer 12 comes into contact with a conductive material other than the first and second semiconductor layers 11 and 13. The insulating film IL may reduce surface defects of the light-emitting element LD, thereby improving the lifetime and luminous efficiency of the light-emitting element LD. In case that the light-emitting elements LD are closely disposed on the growth substrate 101, the insulating film IL may prevent an undesired short circuit that may occur between the light-emitting elements LD. As long as the active layer 12 may be prevented from being short-circuited to an external conductive material, whether or not the insulating film IL is provided is not limited.

The insulating film IL may be provided in a form which completely surrounds outer peripheral surfaces of the second semiconductor layer 13, the active layer 12, the first semiconductor layer 11, and the third semiconductor layer 15, but the disclosure is limited thereto. The insulating film IL may not surround an outer peripheral surface of the bonding electrode BDE1 such that the bonding electrode BDE1 is exposed to the outside.

The light-emitting elements LD formed on the growth substrate 101 are cut along a cutting line using a laser or the like or are separated into individual pieces through an etching process, and the light-emitting elements LD may be separated from the growth substrate 101 through a laser lift-off process.

In FIG. 7, "P" may refer to a pitch interval between the light-emitting elements LD, "S" may refer to a spacing distance between the light-emitting elements LD, and "W" may refer to a width of the light-emitting element LD. Although 7 illustrates that a cross-sectional shape of the light-emitting element LD is a substantially quadrangular shape, the disclosure is not limited thereto, and the light-emitting element LD may have a cross-sectional shape such as a substantially circular cross sectional shape other than a substantially rectangular cross-sectional shape according to a method of manufacturing the growth substrate 101.

In the following embodiments, each light-emitting element LD may include the third semiconductor layer 15, and an example will be described in which the third semiconductor layer 15 is a semiconductor layer doped with impurities which is electrically connected to a second electrode CE to be described with reference to FIG. 8.

Figure 8:
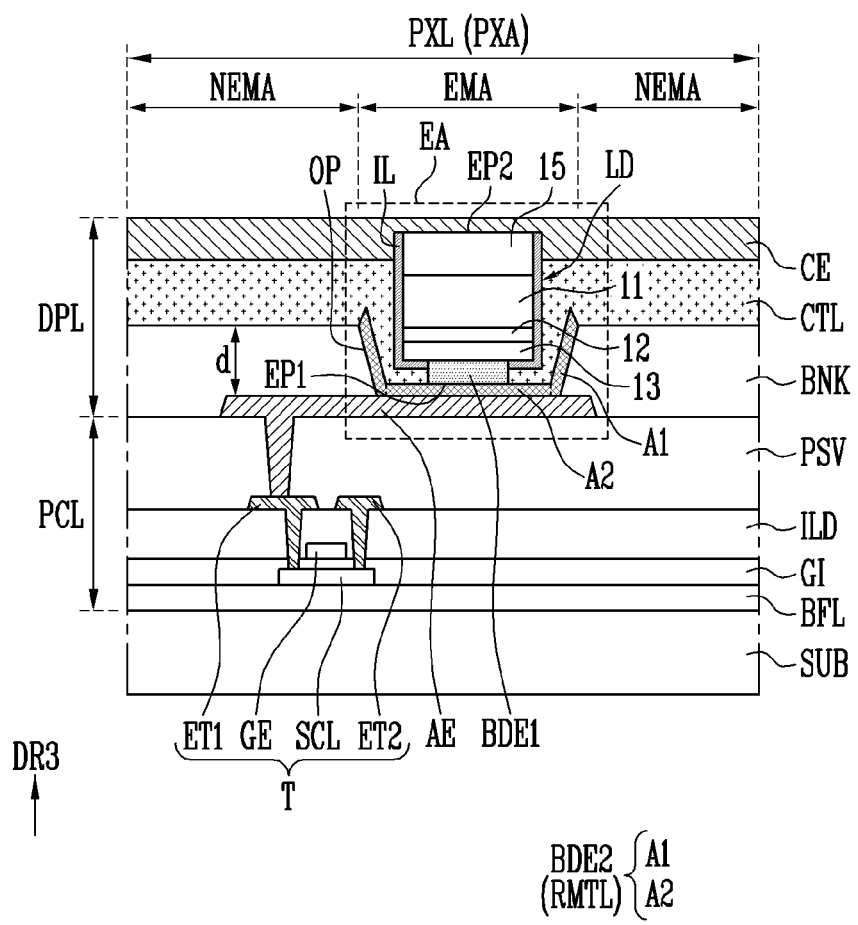
FIGS. 8 and 9 are schematic views illustrating a pixel in accordance with an embodiment and are schematic cross-sectional views for describing a connection structure between a transistor (for example, a first transistor) and a light-emitting element) illustrated in FIG. 6.
Figure 9:
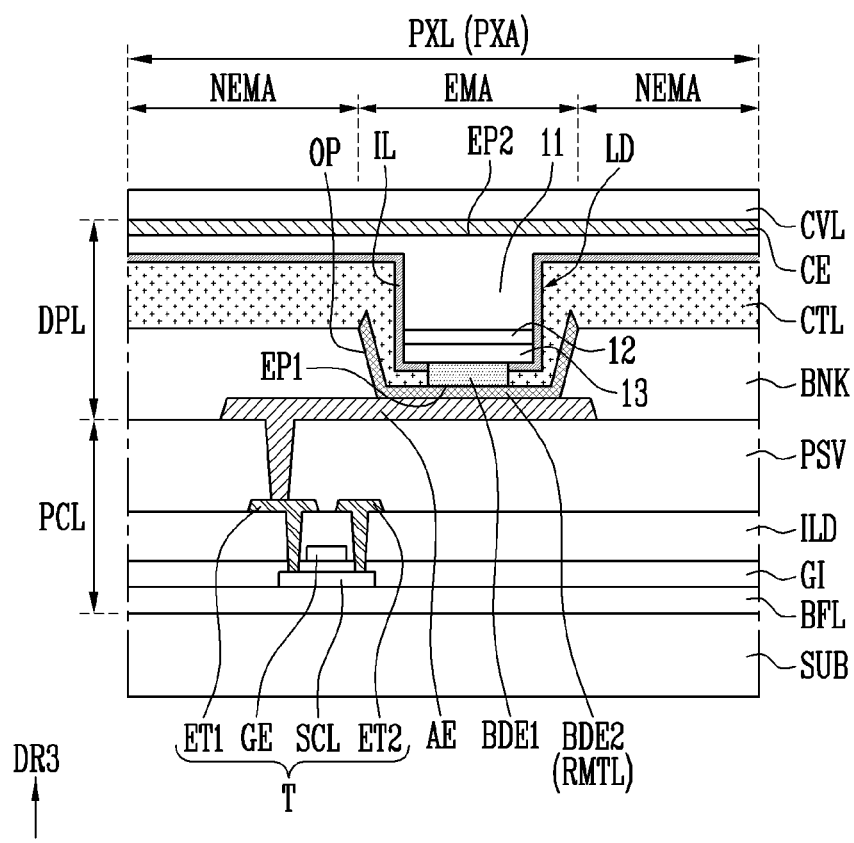
Figure 10A:
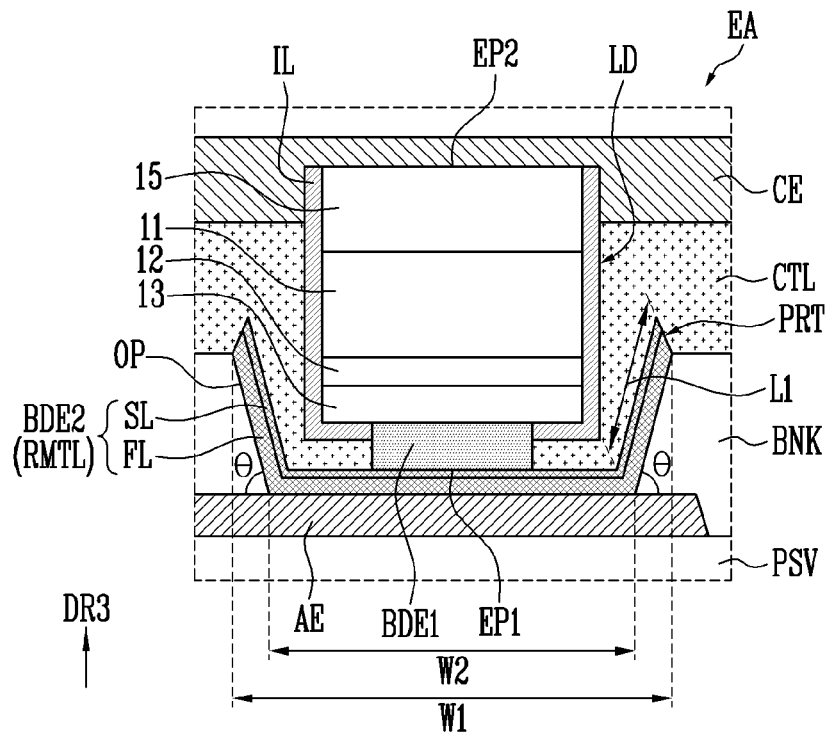
FIGS. 10A to 10C are enlarged views of area EA of FIG. 8.
Figure 10B:
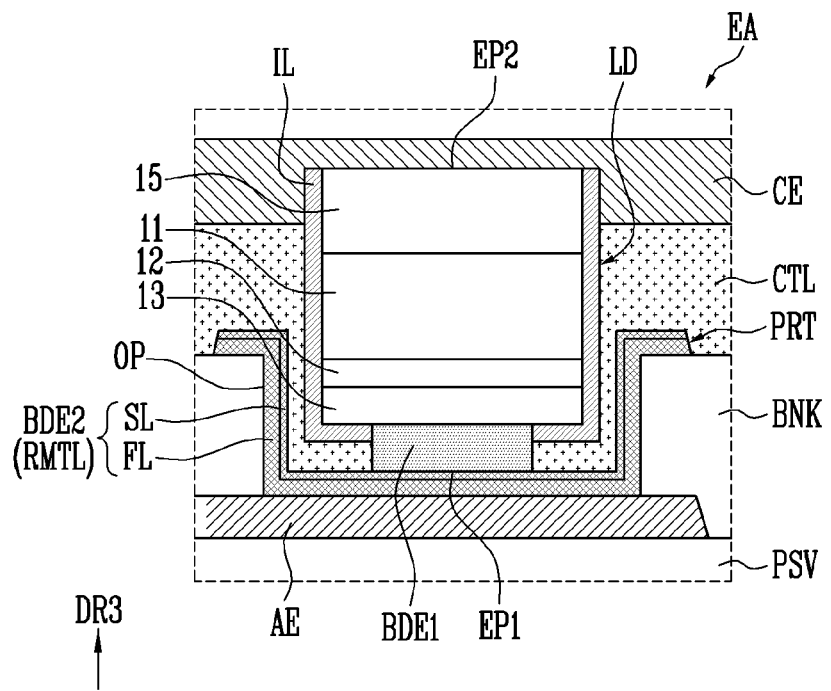
Figure 10C:
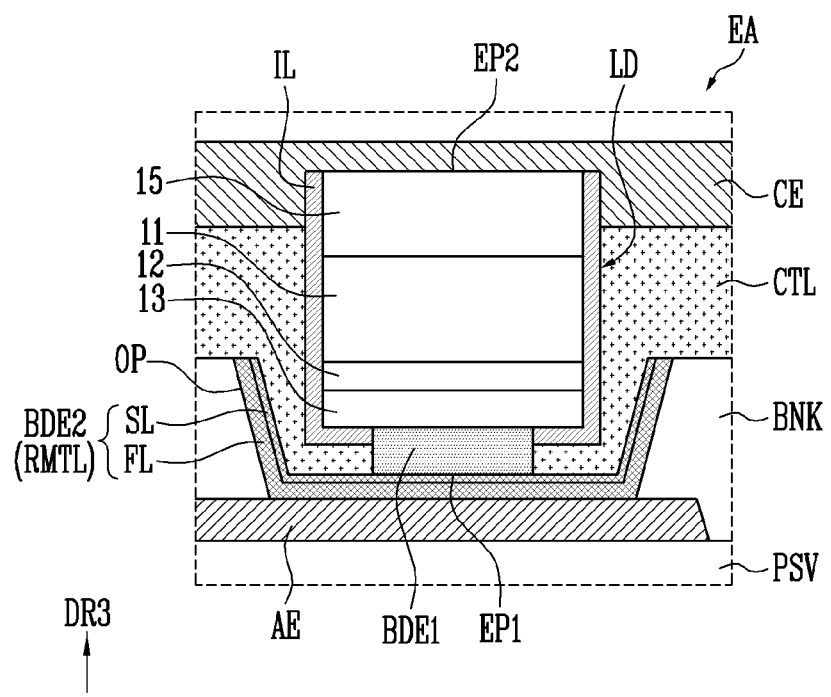

FIGS. 8 and 9 are schematic views illustrating a pixel PXL in accordance with an embodiment and are schematic cross-sectional views for describing a connection structure between a transistor T (for example, a first transistor T1) and a light-emitting element LD illustrated in FIG. 6. FIGS. 10A to 10C are enlarged views of area EA of FIG. 8.

In an embodiment, a thickness direction of a substrate SUB on a cross-section is expressed as a third direction DR3 for convenience of description.

In addition, the term "connection" between two components may refer to that both an electrical connection and a physical connection are used inclusively, but the disclosure is not limited thereto.

In describing embodiments, "formed and/or provided or disposed on the same layer" or a same layer may refer to "formed in the same process," and "formed and/or provided or disposed on different layers" may refer to "formed through different processes." However, the disclosure is not limited thereto.

Although one pixel PXL is illustrated in FIGS. 8 to 10C, the disclosure is not limited thereto.

Referring to FIGS. 1 to 10C, each pixel PXL according to an embodiment may be provided and/or positioned in a pixel area PXA provided on the substrate SUB. The pixel area PXA is one area or an area of a display area DA and may include an emission area EMA and a non-emission area NEMA.

The pixel PXL may include the substrate SUB, a pixel circuit layer PCL, and a display element layer DPL.

One or more insulating layers and one or more conductive layers may be disposed on the substrate SUB. For example, the insulating layers may include a buffer layer BFL, a gate insulating layer GI, an interlayer insulating layer ILD, a passivation layer PSV, a bank BNK, and the like which may be sequentially stacked each other on the substrate SUB. The conductive layers may include conductive layers positioned between the insulating layers.

Since the substrate SUB has the same configuration as the substrate SUB described with reference to FIG. 3, a detailed description thereof will be omitted.

The pixel circuit layer PCL may include the buffer layer BFL, a pixel circuit PXC including the transistor T provided on the buffer layer BFL, and the passivation layer PSV.

The buffer layer BFL may be provided and/or formed on one surface or a surface of the substrate SUB. The buffer layer BFL may prevent impurities from being diffused into the transistor T included in the pixel circuit PXC. The buffer layer BFL may be an inorganic insulating film including an inorganic material. The buffer layer BFL may include at least one selected from metal oxides such as silicon nitride ($SiN_x$), silicon oxide ($SiO_x$), silicon oxynitride ($SiO_xN_y$), and aluminum oxide ($AlO_x$). The buffer layer BFL may be provided as a single film but may also be provided as at least two layers. In case that the buffer layer BFL is provided as multiple layers, the layers may be made of the same material or a similar material or different materials. The buffer layer BFL may be omitted according to the material and process conditions of the substrate SUB.

The transistor T may include a driving transistor for controlling a driving current of the light-emitting element LD and a switching transistor electrically connected to the driving transistor. Here, the driving transistor may be the first transistor T1 described with reference to FIG. 6, and the switching transistor may be the second transistor T2 described with reference to FIG. 6. For convenience, only the driving transistor T corresponding to the first transistor T1 is illustrated in FIGS. 8 and 9.

The driving transistor T may include a semiconductor pattern SCL, a gate electrode GE, a first terminal ET1, and a second terminal ET2. The first terminal ET1 may be any one electrode of a source electrode and a drain electrode, and the second terminal ET2 may be the remaining electrode of the source electrode and the drain electrode. As an example, the first terminal ET1 may be the source electrode, and the second terminal ET2 may be the drain electrode.

The semiconductor pattern SCL may be provided and/or formed on the buffer layer BFL. The semiconductor pattern SCL may include a first contact region in contact with the first terminal ET1 and a second contact region in contact with the second terminal ET2. A region between the first contact region and the second contact region may be a channel region. The channel region may overlap the gate electrode GE of the driving transistor T. The semiconductor pattern SCL may be a semiconductor pattern made of poly silicon, amorphous silicon, an oxide semiconductor, or the like within the spirit and the scope of the disclosure. The channel region may be, for example, a semiconductor pattern that may not be doped with impurities and may be an intrinsic semiconductor. The first contact region and the second contact region may be semiconductor patterns doped with impurities. As the impurities, for example, p-type impurities may be used, but the disclosure is not limited thereto.

The gate insulating layer GI may be provided and/or formed on the semiconductor pattern SCL.

The gate insulating layer GI may be entirely provided on the semiconductor pattern SCL and the buffer layer BFL to cover or overlap the semiconductor pattern SCL and the buffer layer BFL. The gate insulating layer GI may be an inorganic insulating film including an inorganic material. As an example, the gate insulating layer GI may include at least one selected from metal oxides such as silicon nitride ($SiN_x$), silicon oxide ($SiO_x$), silicon oxynitride ($SiO_xN_y$), and aluminum oxide ($AlO_x$). However, the material of the gate insulating layer GI is not limited to the above-described embodiments. According to embodiments, the gate insulating layer GI may be formed as an organic insulating film including an organic material. The gate insulating layer GI may be provided as a single layer but may also be provided as at least two layers.

The gate electrode GE may be provided and/or formed on the gate insulating layer GI so as to correspond to the channel region of the semiconductor pattern SCL. The gate electrode GE may be positioned on the gate insulating layer GI to overlap the channel region of the semiconductor pattern SCL. In an embodiment, the gate electrode GE may be formed in a single layer structure made of one selected from the group consisting of copper (Cu), molybdenum (Mo), tungsten (W), aluminum neodymium (AlNd), titanium (Ti), aluminum (Al), silver (Ag), and an alloy thereof, or a mixture thereof or may be formed in a double-layer or multi-layer structure including a low resistance material, such as molybdenum (Mo), titanium (Ti), copper (Cu), aluminum (Al), or silver (Ag) in order to reduce line resistance.

The interlayer insulating layer ILD may be provided and/or formed on the gate electrode GE.

The interlayer insulating layer ILD may include the same material or a similar material as the gate insulating layer GI or may include at least one suitable material selected from the materials described as structure materials of the gate insulating layer GI.

The first terminal ET1 and the second terminal ET2 may be provided and/or formed on the interlayer insulating layer ILD and may be in contact with the first contact region and the second contact region of the semiconductor pattern SCL through contact holes sequentially passing through the gate insulating layer GI and the interlayer insulating layer ILD, respectively. As an example, the first terminal ET1 may be in contact with the first contact region of the semiconductor pattern SCL, and the second terminal ET2 may be in contact with the second contact region of the semiconductor pattern SCL. Each of the first and second terminals ET1 and ET2 may include the same material or a similar material as the gate electrode GE or may include at least one material selected from the materials described as structure materials of the gate electrode GE.

In the above-described embodiment, it have been described that the first and second terminals ET1 and ET2 of the driving transistor T are separate electrodes that are in contact with the semiconductor pattern SCL and are electrically connected to the semiconductor pattern SCL through the contact holes sequentially passing through the gate insulating layer GI and the interlayer insulating layer ILD, but the disclosure is not limited thereto. According to embodiments, the first terminal ET1 of the driving transistor T may be a first contact region adjacent to one side or a side of the channel region of the semiconductor pattern SCL, and the second terminal ET2 of the driving transistor T may be a second contact region adjacent to the other side or another side of the channel region of the semiconductor pattern SCL. The first terminal ET1 of the driving transistor T may be electrically connected to the light-emitting element LD through a separate connection part such as a bridge electrode.

In an embodiment, the driving transistor T may be formed as a low temperature polysilicon (LTPS) thin film transistor, but the disclosure is not limited thereto. According to embodiments, the driving transistor T may be formed as an oxide semiconductor thin film transistor. Furthermore, in the above-described embodiment, an example has been described in which the driving transistor T is a thin film transistor having a top gate structure, but the disclosure is not limited thereto. The structure of the driving transistor T may be variously changed.

Although not directly illustrated in FIGS. 8 and 9, the pixel circuit layer PCL may further include signal lines (for example, scan lines and data lines) electrically connected to the driving transistor T and power lines (for example, first and second power lines). As an example, the power lines may be the first and second power lines PL1 and PL2 described with reference to FIG. 6. Each of the first and second power lines PL1 and PL2 may include a conductive material (or a substance). As an example; each of the first and second power lines PL1 and PL2 may be formed in a single layer (or single film) structure made of one selected from the group consisting of copper (Cu), molybdenum (Mo), tungsten (W), aluminum neodymium (AlNd), titanium (Ti), aluminum (Al), silver (Ag), and an alloy thereof, or a mixture thereof or may be formed in a double film (or double film) or multi-layer (or a multi-film) structure including a low resistance material, such as molybdenum (Mo), titanium (Ti), copper (Cu), aluminum (Al), or silver (Ag) in order to reduce line resistance. As an example, each of the first and second power lines PL1 and PL2 may be formed as a double-layer (or a double-film) in which titanium (Ti) and copper (Cu) may be sequentially stacked each other.

The passivation layer PSV may be provided and/or formed on the driving transistor T.

The passivation layer PSV (also referred to as a "protective layer" or "via layer") may be an inorganic insulating film including an inorganic material or an organic insulating film including an organic material. The inorganic insulating film may include, for example, at least one selected from metal oxides such as silicon oxide ($SiO_x$), silicon nitride ($SiN_x$), silicon oxynitride ($SiO_xN_y$), and aluminum oxide ($AlO_x$). The organic insulating film may include, for example, at least one selected from an acrylic-based resin (polyacrylate-based resin), an epoxy-based resin, a phenolic-based resin, a polyamide-based resin, a polyimide-based resin, an unsaturated polyester-based resin, a poly-phenylen ether-based resin, a poly-phenylene sulfide-based resin, and a benzocyclobutene resin.

According to embodiments, the passivation layer PSV may include the same material or a similar material as the interlayer insulating layer ILD, but the disclosure is not limited thereto. The passivation layer PSV may be provided as a single layer but may also be provided as at least two layers.

The passivation layer PSV may be partially opened to expose the first terminal ET1 of the driving transistor T to the outside.

The display element layer DPL may be provided and/or formed on the passivation layer PSV.

The display element layer DPL may include a first electrode AE, the light-emitting element LD, and a second electrode CE.

The first electrode AE may be provided and/or formed on the pixel circuit layer PCL. The first electrode AE may be positioned under or below the light-emitting element LD and may be electrically connected to a first end portion EP1 of the light-emitting element LD. The second electrode CE may be positioned on the light-emitting element LD and may be electrically connected to a second end portion EP2 of the light-emitting element LD. In case that viewed on a cross section, the first electrode AE and the second electrode CE may face each other in the third direction DR3 with the light-emitting element LD interposed therebetween.

The first electrode AE may be electrically connected to the first terminal ET1 of the driving transistor T through a contact hole passing through the passivation layer PSV. In an embodiment, the first electrode AE may be an anode.

The first electrode AE may be made of a conductive material (or a substance) having reflectivity (for example, a reflectivity) in order to allow light emitted from the light-emitting element LD to travel in an image display direction (or a front direction) of a display device DD. The conductive material may include an opaque metal advantageous in reflecting light emitted from the light-emitting elements LD in the image display direction (or a desired direction) of the display device DD. The opaque metal may include, for example, a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), or an alloy thereof. According to embodiments, the first electrode AE may include a transparent conductive material (or a substance). The transparent conductive material (or the substance) may include a conductive material such as indium tin oxide (ITO), indium zinc oxide (IZO), zinc oxide (ZnO), indium gallium zinc oxide (IGZO), or indium tin zinc oxide (ITZO), or a conductive polymer such as poly(3,4-ethylenedioxythiophene) (PEDOT). In case that the first electrode AE may include the transparent conductive material (or the substance), a separate conductive layer made of an opaque metal may be added to reflect light emitted from each of the light-emitting elements LD in the image display direction of the display device DD. However, the material of the first electrode AE is not limited to the above-described materials.

The first electrode AE may be provided and/or formed as a single layer, but the disclosure is not limited thereto. According to embodiments, the first electrode AE may be provided and/or formed as a multi-layer in which at least two or more selected from metals, alloys, conductive oxides, and conductive polymers may be stacked each other. In order to minimize distortion due to a signal delay in case that a signal (or a voltage) is transmitted to the first end portion EP1 of the light-emitting element LD, the first electrode AE may be formed as at least two layers.

The bank BNK may be provided and/or formed on the first electrode AE.

The bank BNK may be positioned in the non-emission area NEMA to constitute a pixel definition film which partitions the emission area EMA of the pixel PXL. The bank BNK may include an opening OP exposing a portion of the first electrode AE. The bank BNK may be partially opened to expose a portion of the first electrode AE. According to an embodiment, the emission area EMA of the pixel PXL and the opening OP of the bank BNK may correspond to each other.

The bank BNK may include at least one light blocking material and/or a reflective material (or a scattering material) to prevent light leakage between adjacent pixels PXL. According to embodiments, the bank BNK may be an organic insulating film including an organic material. As an example, the bank BNK may be formed as an organic film made of an acryl resin, an epoxy resin, a phenolic resin, a polyamide resin, a polyimide resin, or the like within the spirit and the scope of the disclosure. According to embodiments, the bank BNK may include a transparent material. The transparent material may include, for example, a polyamide-based resin, a polyimide-based rein, or the like, but the disclosure is not limited thereto. According to an embodiment, a reflective material layer may be separately provided and/or formed on the bank BNK in order to further improve efficiency of light emitted from the pixel PXL.

A conductive pattern BDE2 (or a second bonding electrode) may be provided and/or formed in the opening OP of the bank BNK.

The conductive pattern BDE2 may be provided and/or formed on a side surface of the bank BNK and the first electrode AE in the opening OP to surround the opening OP. The conductive pattern BDE2 may be a medium which is bonded to the bonding electrode BDE1 of the light-emitting element LD to electrically connect the driving transistor T and the light-emitting element LD. In an embodiment, the conductive pattern BDE2 may be used as a reflective member RMTL which guide light emitted from the light-emitting element LD in the image display direction of the display device DD. To this end, the conductive pattern BDE2 may be made of an opaque conductive material having a reflectivity. As an example, the conductive pattern BDE2 may include the same material or a similar material as the first electrode AE or may include at least one suitable material selected from the materials described as structure materials of the first electrode AE.

The conductive pattern BDE2 may include a first portion A1 and a second portion A2. As an example, the conductive pattern BDE2 may include the first portion A1 positioned on the side surface of the bank BNK and the second portion A2 positioned on the first electrode AE. The second portion A2 may be positioned on an upper surface of the first electrode AE and may have a flat profile, and the first portion A1 may be positioned on the side surface of the bank BNK and may have a profile corresponding to or substantially corresponding to a shape of the side surface of the bank BNK. As an example, the first portion A1 may have an inclination. As illustrated in FIGS. 10A and 10C, in case that the side surface of the bank BNK has an inclination angle θ (or a gradient), the first portion A1 of the conductive pattern BDE2 may also have an inclination corresponding to the inclination angle θ of the side surface of the bank BNK. The inclination angle θ of the side surface of the bank BNK may be close to 90° but is not limited thereto.

The side surface of the bank BNK may be designed to have a relatively steep inclination angle θ in order for the conductive pattern BDE2 to guide light emitted from the light-emitting element LD in the image display direction.

As described above, in case that the first portion A1 of the conductive pattern BDE2 has the inclination, light emitted from an active layer 12 of the light-emitting element LD may be reflected is transmitted in the image display direction of the display device DD by the conductive pattern BDE2. The first portion A1 of the conductive pattern BDE2 may guide light emitted radially (or in substantially a radial shape) from the light-emitting element LD to an image display area (or a target area) so that the luminous efficiency of the pixel PXL may be achieved.

In case that the side surface of the bank BNK has the inclination angle θ (or the gradient), a width of the opening OP may vary in the third direction DR3. Here, the width of the opening OP may refer to a distance between two side surfaces of the bank BNK facing each other with the opening OP interposed therebetween. In an embodiment, a first width W1 and a second width W2 of the opening OP may be different from each other. The first width W1 may be greater than the second width W2. The second width W2 may refer to a distance between two side surfaces of the bank BNK in contact with the first electrode AE with the opening OP interposed therebetween, and the first width W1 may refer to a distance between two side surfaces of the bank BNK in contact with an intermediate layer CTL with the opening OP interposed therebetween. The first and second widths W1 and W2 may be greater than a width W of the light-emitting element LD. For example, the first and second widths W1 and W2 may be about 5 μm or more, the first width W1 may be about 6 μm, and the second width W2 may be about 5 μm, but the disclosure is limited thereto. The opening OP may be designed to have a width (or a size) to such an extent as to allow the light-emitting element LD to be sufficiently inserted therein.

In the above embodiment, it has been described that the side surface of the bank BNK has the inclination angle θ (or the gradient) in a diagonal direction inclined to the third direction DR3, but the disclosure is not limited thereto. According to embodiments, as illustrated in FIG. 10B, the side surface of the bank BNK may be a side surface parallel to the third direction DR3 and perpendicular to the upper surface of the first electrode AE. The first portion A1 of the conductive pattern BDE2 may also have a side surface that may be perpendicular to the first electrode AE.

In an embodiment, the second portion A2 of the conductive pattern BDE2 may be disposed on the first electrode AE to reflect light, which travels toward the pixel circuit layer PCL from the active layer 12 of the light-emitting element LD, in the image display direction together with the first electrode AE.

The conductive pattern BDE2 may be bonded to the bonding electrode BDE1 of the light-emitting element LD to electrically connect the light-emitting element LD and the first electrode AE and concurrently may be used as the reflective member RMTL which guides and collimates light emitted from the light-emitting element LD in the image display direction.

According to embodiments, the conductive pattern BDE2 may be provided to include a protrusion PRT protruding into one area or an area of the intermediate layer CTL along the side surface of the bank BNK. The protrusion PRT may be formed in a manufacturing process of forming the conductive pattern BDE2. In case that the conductive pattern BDE2 is provided to include the protrusion PRT, the first portion A1 positioned on the side surface of the bank BNK extends to one area or an area of the intermediate layer CTL and guides (reflects) light emitted from the light-emitting element LD in the image display direction, and thus, the luminous efficiency of the pixel PXL may be further improved. In case that the conductive pattern BDE2 may include the protrusion PRT, a length L1 of the first portion A1 of the conductive pattern BDE2 may be greater than a distance L1 between an upper surface of the bank BNK and the first electrode AE. For example, in case that the distance d between the upper surface of the bank BNK and the first electrode AE is about 2 μm, the length L1 of the first portion A1 of the conductive pattern BDE2 may be greater than about 2 μm.

According to embodiments, as illustrated in FIG. 10C, the conductive pattern BDE2 may not include the protrusion PRT. An end of the first portion A1 of the conductive pattern BDE2 may be positioned on a same line (or a same plane) as the upper surface of the bank BNK.

In an embodiment, as illustrated in FIGS. 10A to 10C, the conductive pattern BDE2 may be formed as a double-layer including a first layer FL and a second layer SL positioned on the first layer FL.

The first layer FL may be positioned on the first electrode AE and the side surface of the bank BNK to be in contact with or in direct contact with the first electrode AE and the side surface of the bank BNK. The first layer FL may be a metal layer which is in contact with or in direct contact with the first electrode AE and is electrically connected to the first electrode AE and may be made of at least one selected from titanium (Ti), copper (Cu), nickel (Ni), and the like within the spirit and the scope of the disclosure. The first layer FL may have a certain or given level or more of thickness in order to reduce a step difference between the first electrode AE and the light-emitting element LD, but the disclosure is not limited thereto.

The second layer SL may be a metal layer which is in contact with or in direct contact with the bonding electrode BDE1 of the light-emitting element LD and electrically connected to the light-emitting element LD. In case that the second layer SL is bonded to the bonding electrode BDE1 of the light-emitting element LD, the second layer SL may be made of at least one selected from gold (Au) and tin (Sn) having high bonding strength (or adhesive strength) in order to facilitate the formation and growth of an intermetallic compound between the second layer SL and the bonding electrode BDE1 of the light-emitting element LD. According to embodiments, the conductive pattern BDE2 may be formed as a single layer including only the second layer SL.

The conductive pattern BDE2 including the first layer FL and second layer SL may have a thickness in a range of about 1 μm to about 1.5 μm in the third direction DR3, but the disclosure is not limited thereto.

The intermediate layer CTL may be provided and/or formed on the bank BNK and the conductive pattern BDE2.

The intermediate layer CTL may be entirely applied on the bank BNK and the conductive pattern BDE2 through spin coating. In an embodiment, the intermediate layer CTL may be provided on the bank BNK and the conductive pattern BDE2 in a form which fills the opening OP.

The intermediate layer CTL may include an organic material that enhances adhesive strength between the light-emitting element LD and the conductive pattern BDE2 while stably fixing the light-emitting element LD. For example, the intermediate layer CTL may be a transparent adhesive layer (or a bonding layer) but is not limited thereto. According to embodiments, the intermediate layer CTL may be a refractive index conversion layer which converts a refractive index of light, which is emitted from the light-emitting element device LD and travels in the image display direction, thereby improving output luminance of the pixel PXL.

In an embodiment, the intermediate layer CTL may be made of an organic material. The organic material may include, for example, at least one selected from a photocurable resin including a photopolymerization initiator cross-linked and cured by light such as ultraviolet (UV) and or a thermosetting polymer resin including a thermal polymerization initiator that initiates a curing reaction by heat. For example, the thermosetting resin may include an epoxy resin composed of an organic material, an amino resin, a phenol resin, a polyester resin, or the like within the spirit and the scope of the disclosure. The intermediate layer CTL may be cured by light or heat in a process in which the light-emitting element LD and the conductive pattern BDE2 are bonded to each other. Accordingly, the intermediate layer CTL may prevent the light-emitting element LD from being separated while stably fixing the light-emitting element LD.

The light-emitting element LD may be provided and/or positioned on the intermediate layer CTL. In an embodiment, each pixel PXL may include one light-emitting element LD. One light-emitting element LD may be provided as a light source of each pixel PXL. However, the disclosure is not limited thereto.

The light-emitting element LD may implement a light-emitting stack in which the bonding electrode BDE1, a second semiconductor layer 13, the active layer 12, a first semiconductor layer 11, and a third semiconductor layer 15 may be sequentially stacked each other. The bonding electrode BDE1 may be positioned at the first end EP1 of the light-emitting element LD, and the third semiconductor layer 15 may be positioned at the second end EP2 of the light-emitting element LD. The bonding electrode BDE1 may be in contact with or in direct contact with the second layer SL of the conductive pattern BDE2 and bonded to the conductive pattern BDE2. The third semiconductor layer 15 may be in contact with or in direct contact with the second electrode CE and electrically connected to the second electrode CE.

According to embodiments, as illustrated in FIG. 9, the light-emitting element LD may implement a light-emitting stack in which the bonding electrode BDE1, the second semiconductor layer 13, the active layer 12, and the first semiconductor layer 11 may be sequentially stacked each other from the conductive pattern BDE2 in the third direction DR3. The bonding electrode BDE1 may be positioned at the first end EP1 of the light-emitting element LD, and the first semiconductor layer 11 may be positioned at the second end EP2 of the light-emitting element LD. The bonding electrode BDE1 may be in contact with or in direct contact with the second layer SL of the conductive pattern BDE2 and bonded to the conductive pattern BDE2, and the first semiconductor layer 11 may be in contact with or in direct contact with the second electrode CE and electrically connected to the second electrode CE.

According to embodiments, as illustrated in FIG. 9, the first semiconductor layer 11 of the light-emitting element LD may be entirely disposed on the intermediate layer CTL and electrically connected to a common electrode (not illustrated) disposed in a non-display area NDA. The first semiconductor layers 11 of the light-emitting elements LD disposed in the pixels PXL may be connected to the common electrode. As an example, in case that three pixels PXL are disposed in the display area DA, the first semiconductor layer 11 of the light-emitting element LD disposed in one pixel PXL of the three pixels PXL, the first semiconductor layer 11 of the light-emitting element LD disposed in another pixel PXL of the three pixels PXL, and the first semiconductor layer 11 of the light-emitting element LD disposed in still another pixel PXL of the three pixels PXL may be connected to the common electrode. A more detailed description related thereto will be given below with reference to FIG. 14B.

After the light-emitting element LD transferred onto a transfer substrate by a transfer mechanism is moved to an upper portion of the intermediate layer CTL so as to correspond to the opening OP of the bank BNK, the light-emitting element LD may be re-transferred into the opening OP. In a process, while the intermediate layer CTL made of a fluidity organic material filling the inside of the opening OP is moved, the bonding electrode BDE1 of the light-emitting element LD may come into contact with or direct contact with the conductive pattern BDE2.

A bonding method may be used to electrically connect the light-emitting element LD and the first electrode AE. As the bonding method, an anisotropic conductive film (AFC) bonding method, a laser assist bonding (LAB) method using laser, an ultrasonic bonding method, a bump-ball surface mounting method (ball grid array (BGA)), or a thermo compression (TC) bonding method may be used. The TC bonding method may refer to a method in which, after the bonding electrode BDE1 and the conductive pattern BDE2 are brought into contact with each other, the bonding electrode BDE1 and the conductive pattern BDE2 are heated to a temperature higher than melting points of the bonding electrode BDE1 and the conductive pattern BDE2, and, pressure is applied to electrically and physically connect the bonding electrode BDE1 and the conductive pattern BDE2.

As described above, after the light-emitting element LD is positioned in the opening OP and the bonding electrode BDE1 and the conductive pattern BDE2 may be brought into contact with each other, a bonding process using the TC bonding method may be performed to electrically connect the bonding electrode BDE1 and the conductive pattern BDE2. In case that heat and pressure are applied to bond the bonding electrode BDE1 to the conductive pattern BDE2, an intermetallic compound may be formed and grown between the bonding electrode BDE1 and the conductive pattern BDE2. The light-emitting element LD and the first electrode AE may be electrically and physically connected with the intermetallic compound.

The second electrode CE may be provided and/or formed on the light-emitting element LD bonded to the first electrode AE.

The second electrode CE may be entirely formed on the second end portion EP2 of the light-emitting element LD and the intermediate layer CTL. The second electrode CE may be in contact with the second end portion EP2 of the light-emitting element LD and electrically connected to the second end portion EP2 of the light-emitting element LD. As an example, the second electrode CE may be electrically connected to the third semiconductor layer 15 (or the first semiconductor layer) positioned at the second end portion EP2 of the light-emitting element LD.

The second electrode CE may be made of various transparent conductive materials to allow light emitted from the light-emitting element LD to travel in the image display direction without loss. As an example, the second electrode CE may include at least one selected from various transparent conductive materials (or substances) such as indium tin oxide (ITO), indium zinc oxide (IZO), zinc oxide (ZnO), indium gallium zinc oxide (IGZO), and indium tin zinc oxide (ITZO) and may be substantially transparent or semi-transparent to satisfy desired transmittance (or transmittancy). However, the material of the second electrode CE is not limited to the above-described embodiment.

The second electrode CE may be electrically connected to the second power line PL2. Accordingly, a voltage of a second driving power source VSS applied to the second power line PL2 may be transferred to the second electrode CE. In an embodiment, the second electrode CE may be a cathode.

In the above-described embodiment, it has been described that the second electrode CE is made of a separate conductive material and electrically connected to the third semiconductor layer 15 (or the first semiconductor layer 11) positioned at the second end portion EP2 of the light-emitting element, but the disclosure is not limited thereto. A contact structure between the second electrode CE and the first semiconductor layer 11 of the light-emitting element LD is not limited to the above-described embodiment. According to embodiments, the second electrode CE may be formed through the same process as the first semiconductor layer 11 of the light-emitting element LD and may be electrically connected to the common electrode (not illustrated) positioned in the non-display area NDA.

According to embodiments, as illustrated in FIG. 9, a cover layer CVL may be provided and/or formed on the second electrode CE.

The cover layer CVL may be an encapsulation substrate or an encapsulation film formed as a multi-layer. The cover layer CVL may prevent external air and moisture from permeating into the display element layer DPL and the pixel circuit layer PCL. According to embodiments, the cover layer CVL may be a planarization layer which reduces a step difference generated by components disposed thereunder.

In an embodiment, in case that the conductive pattern BDE2 may be disposed to surround the opening OP so as to be positioned on each of the side surface of the bank BNK and the first electrode AE, the active layer 12 of the light-emitting element LD may face the first portion A1 of the conductive pattern BDE2. Light emitted from the active layer 12 of the light-emitting element LD may be guided in the image display direction by the conductive pattern BDE2. Light traveling toward the pixel circuit layer PCL from the active layer 12 of the light-emitting element LD may also be reflected in the image display direction by the second portion A2 of the conductive pattern BDE2. As a result, an amount of light, which is emitted from the light-emitting element LD and guided (or, propagated) in the image display direction by the conductive pattern BDE2, is increased, thereby improving the luminous efficiency of the pixel PXL.

In the above-described embodiment, since the conductive pattern BDE2 is bonded to the bonding electrode BDE1 to electrically connect the light-emitting element LD and the first electrode AE and is used as the reflective member RMTL which guides light emitted from the light-emitting element LD in the image display direction, an existing manufacturing process of forming a reflective member is omitted, thereby implementing the display device DD through a simplified manufacturing process.

Figure 11:
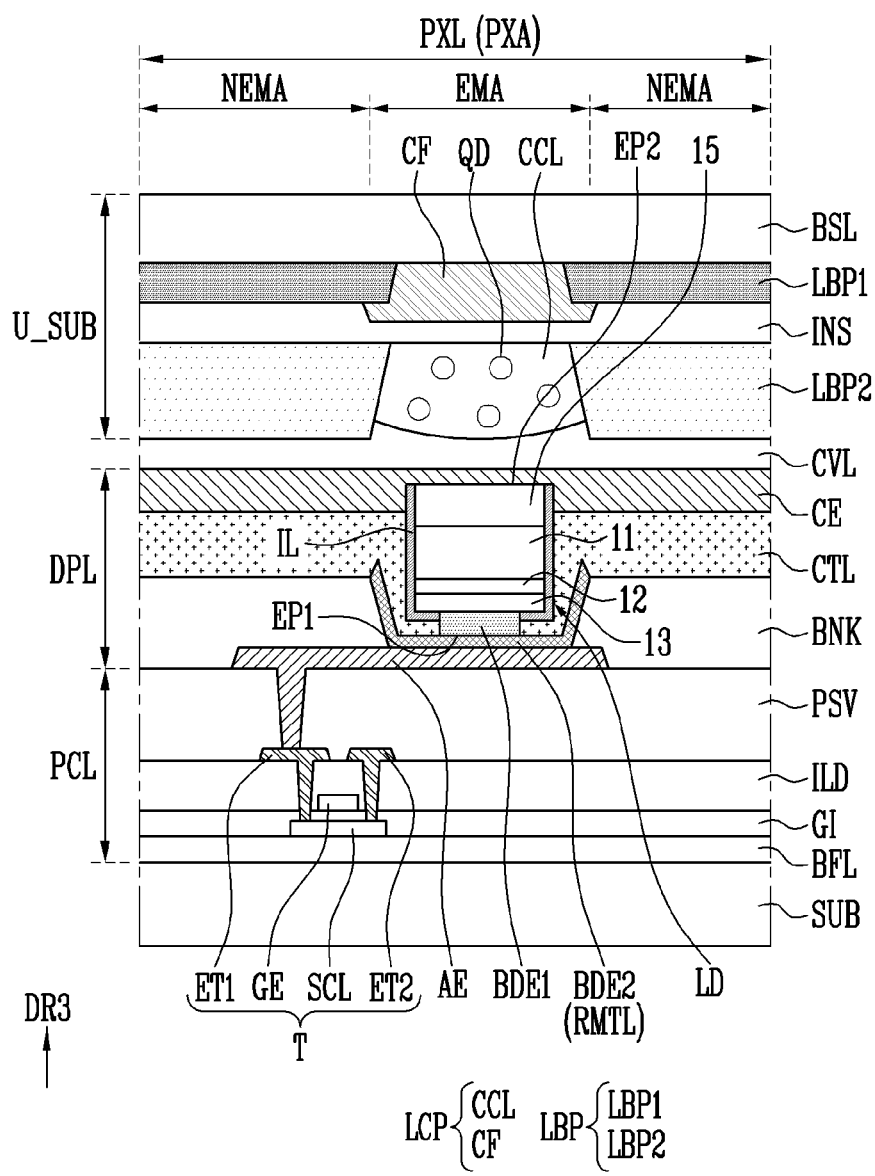
FIGS. 11 and 12 are schematic cross-sectional views illustrating pixels according to an embodiment.
Figure 12:
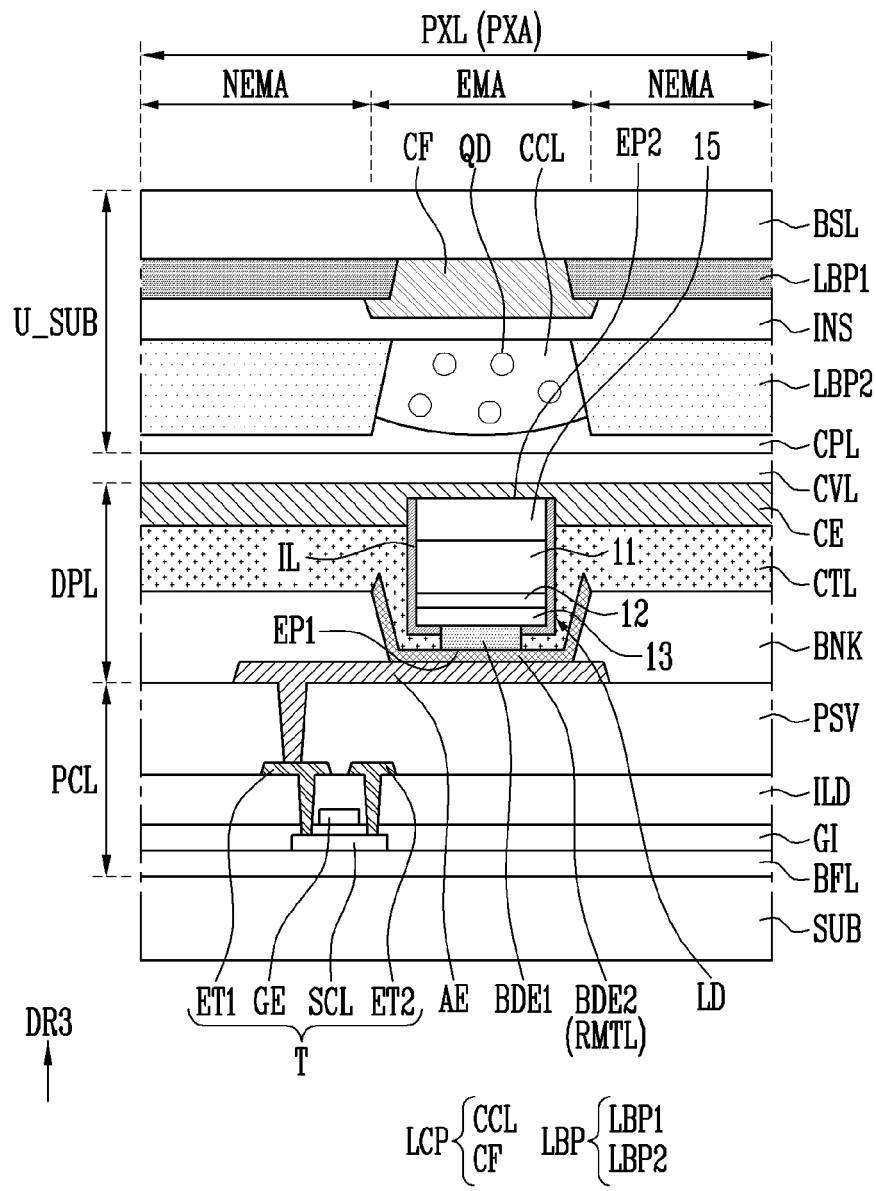

FIGS. 11 and 12 are schematic cross-sectional views illustrating pixels PXL according to an embodiment.

The pixels PXL illustrated in FIGS. 11 and 12 has a configuration substantially the same as or similar to that of the pixel PXL of FIG. 9 except that an upper substrate U_SUB is disposed on a display element layer DPL.

FIGS. 11 and 12 illustrate different embodiments in relation to whether a capping layer CPL is provided. As an example, FIG. 11 illustrates an embodiment in which the upper substrate U_SUB does not include the capping layer CPL, and FIG. 12 illustrates an embodiment in which the upper substrate U_SUB may include the capping layer CPL.

Accordingly, in FIGS. 11 and 12, differences from the above-described embodiment will be described in order to avoid redundant descriptions.

Referring to FIGS. 8 to 12, the upper substrate U_SUB may be provided on a display element layer DPL of the pixel PXL.

The upper substrate U_SUB may be provided on the display element layer DPL to cover or overlap a pixel area PXA.

The upper substrate U_SUB may include a base layer BSL, a light conversion pattern LCP, and a light blocking pattern LBP.

The base layer BSL may be a rigid substrate or a flexible substrate, and the material or physical properties thereof are not particularly limited. The base layer BSL may be made of the same material or a similar material as a substrate SUB or may be made of a material different from that of the substrate SUB.

The light conversion pattern LCP may be disposed on one surface or a surface of the base layer BSL so as to correspond to an emission area EMA of the pixel PXL. The light conversion pattern LCP may include a color conversion layer CCL and a color filter CF which correspond to a color.

The color conversion layer CCL may include color conversion particles QD corresponding to a color. The color filter CF may transmit light having a color.

The color conversion layer CCL may be disposed on one surface or a surface of an insulating layer INS so as to face light-emitting elements LD and may include e pixel PXL or one subpixel and may include the color conversion particles QD that convert light, which is emitted from the light-emitting element LD and reflected by a conductive pattern BDE2, into light having a specific or given color. As an example, in case that the light-emitting element LD emits blue-based light (hereinafter, referred to as "blue light"), the color conversion layer CCL may include color conversion particles QD of white quantum dots that convert the blue light into white light. Here, the color conversion particles QD of the white quantum dots may include red quantum dots and green quantum dots to convert the blue light of the light-emitting element LD into white light. However, the configuration of the color conversion layer CCL is not limited to the above-described embodiment.

The color filter CF may be disposed on one surface or a surface of the base layer BSL so as to face the color conversion layer CCL and may transmit the white light converted by the color conversion layer CCL as red light, green light, or blue light. In case that the pixel PXL is a red pixel, the color filter CF may include a red color filter. In case that the pixel PXL is a green pixel, the color filter CF may include a green color filter. In case that the pixel PXL is a blue pixel, the color filter CF may include a red color filter.

The light conversion pattern LCP including the color conversion layer CCL and the color filter CF may be positioned in the emission area EMA of the pixel PXL. The color conversion layer CCL and the color filter CF may correspond to the conductive pattern BDE2 surrounding an opening OP of a bank BNK.

The insulating layer INS may be provided and/or formed between the color filter CF and the color conversion layer CCL.

The insulating layer INS may be positioned on the color filter CF to protect the color filter CF. The insulating layer INS may be an inorganic insulating film including an inorganic material or an organic insulating film including an organic material.

The light blocking pattern LBP may be positioned adjacent to the light conversion pattern LCP. In an embodiment, the light blocking pattern LBP may be disposed on one surface or a surface of the base layer BSL so as to correspond to a non-emission area NEMA of the pixel PXL. The light blocking pattern LBP may correspond to the bank BNK of the display element layer DPL.

The light blocking pattern LBP may include a first light blocking pattern LBP1 and a second light blocking pattern LBP2.

The first light blocking pattern LBP1 may be disposed on one surface or a surface of the base layer BSL and may be disposed adjacent to the color filter CF. The first light blocking pattern LBP1 may include at least one black matrix material (for example, at least one light blocking material) selected from various types of black matrix materials, a color filter material having a specific or given color, and/or the like within the spirit and the scope of the disclosure.

According to embodiments, the first light blocking pattern LBP1 is provided in the form of a multi-layer in which at least two color filters, transmit different colors of light among a red color filter, a green color filter, and a blue color filter, overlap each other. As an example, the first light blocking pattern LBP1 may be provided in a form which may include a red color filter, a green color filter positioned on the red color filter to overlap the red color filter, and a green color filter positioned on the green color filter to overlap the green color filter. The first light blocking pattern LBP1 may be provided in the form of a structure in which a red color filter, a green color filter, and a blue color filter may be sequentially stacked each other. In the non-emission area NEMA of the pixel area PXA, the red color filter, the green color filter, and the blue color filter may be used as the first light blocking pattern LBP1 blocking light transmission.

The insulating layer INS may be provided and/or formed on the primary light blocking pattern LBP1. The insulating layer INS may be entirely disposed on the first light blocking pattern LBP1 and the color filter CF.

The second light blocking pattern LBP2 may be provided and/or formed on one surface or a surface of the insulating layer INS so as to correspond to the first light blocking pattern LBP1. The second light blocking pattern LBP2 may be a black matrix. The first light blocking pattern LBP1 and the second light blocking pattern LBP2 may include the same material or a similar material. In an embodiment, the second light blocking pattern LBP2 may be a structure which finally defines the emission area EMA of the pixel PXL. As an example, the second light blocking pattern LBP2 may be a dam structure which finally defines the emission area EMA to which the color conversion layer CCL is to be supplied in an operation of supplying the color conversion layer CCL including the color conversion particles QD.

The upper substrate U_SUB may be disposed on a cover layer CVL and connected or coupled to the display element layer DPL. To this end, the cover layer CVL may include a transparent adhesive layer (or a bonding layer) for strengthening adhesive strength between the display element layer DPL and the upper substrate U_SUB.

According to embodiments, as illustrated in FIG. 12, the upper substrate U_SUB may further include a capping layer CPL formed entirely on the color conversion layer CCL and the second light blocking pattern LBP2.

The capping layer CPL may include at least one selected from metal oxides such as silicon nitride ($SiN_x$), silicon oxide ($SiO_x$), silicon oxynitride ($SiO_xN_y$), and aluminum oxide ($AlO_x$). The capping layer CPL may be disposed on the color conversion layer CCL to protect the color conversion layer CCL from external moisture and moisture, thereby further improving the reliability of the color conversion layer CCL.

As described above, in a display device DD (see FIG. 1) in accordance with an embodiment, the light conversion pattern LCP is disposed on the light-emitting element LD to emit light having excellent color reproducibility through the light conversion pattern LCP, thereby improving luminous efficiency.

FIGS. 13A to 13H are schematic cross-sectional views sequentially illustrating a method of manufacturing the pixel PXL of FIG. 8.

In the specification, although it will be described that some manufacturing operations of a display device may be sequentially performed according to the cross sectional views, unless the spirit and scope of the disclosure is changed, some operations illustrated as being consecutively performed may be performed simultaneously, a sequence of each operation may be changed, some operations may be omitted, or another operation may be included between respective operations within the spirit and the scope of the disclosure.

In order to avoid redundant descriptions with respect to FIGS. 13A to 13H, differences from the above-described an embodiment will be described.

Figure 13A:
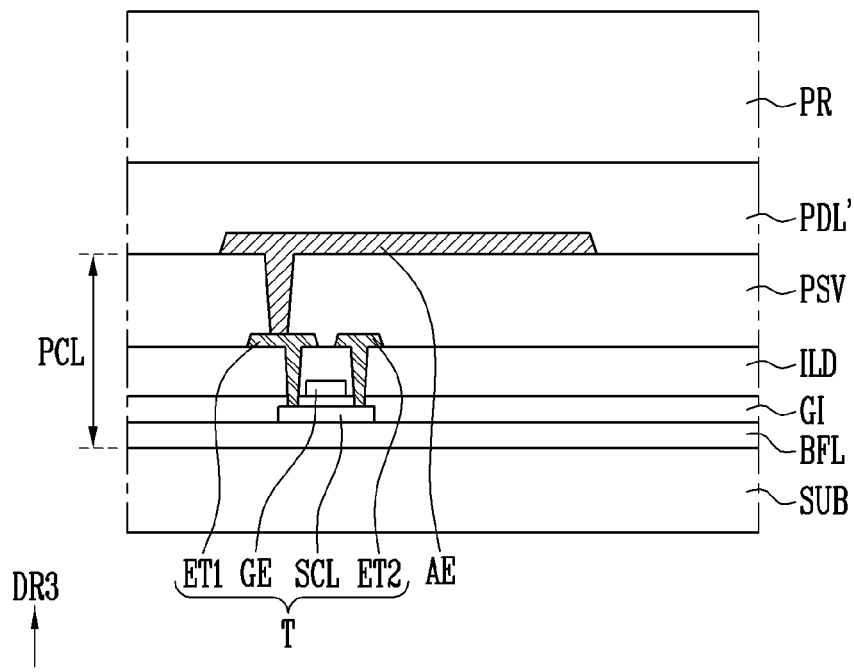
FIGS. 13A to 13H are schematic cross-sectional views sequentially illustrating a method of manufacturing the pixel of FIG. 8.

Referring to FIGS. 8 and 13A, an insulating material layer PDL' corresponding to a base material of a bank BNK is formed on a first electrode AE. A photosensitive material layer PR is formed on the insulating material layer PDL'. Here, the photosensitive material layer PR may include a negative photosensitive material.

Figure 13B:
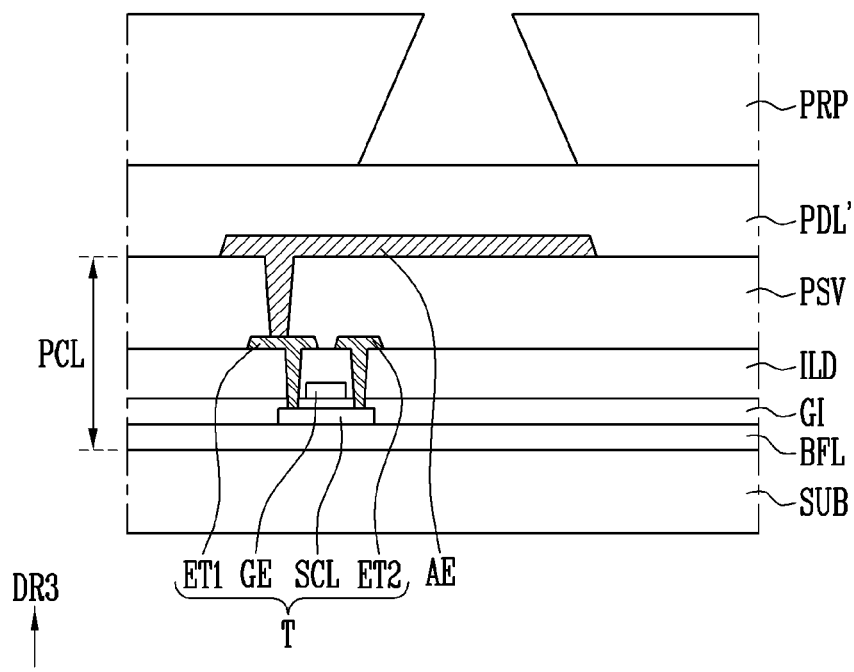
Figure 13C:
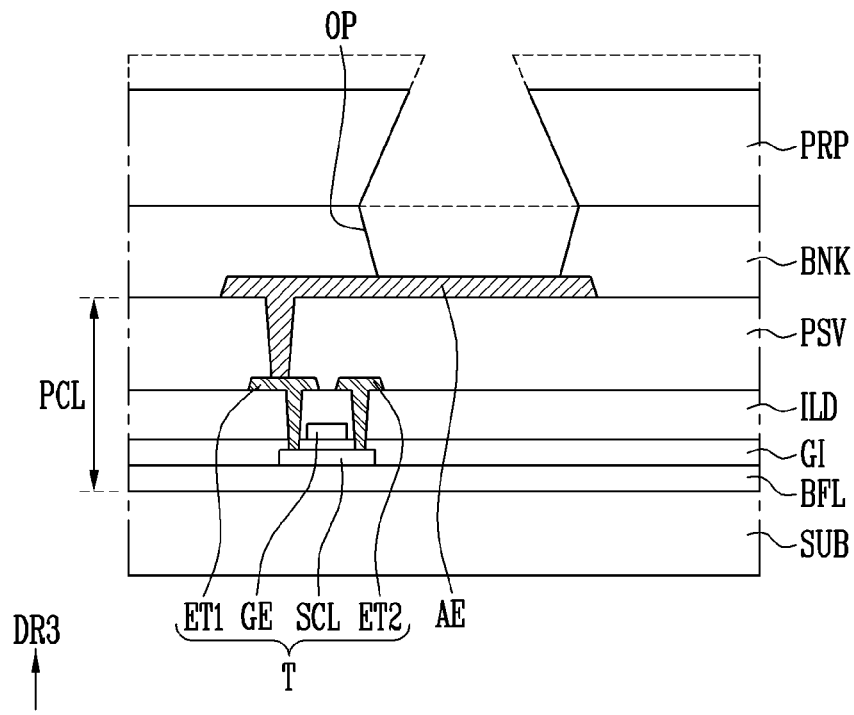
Figure 13D:
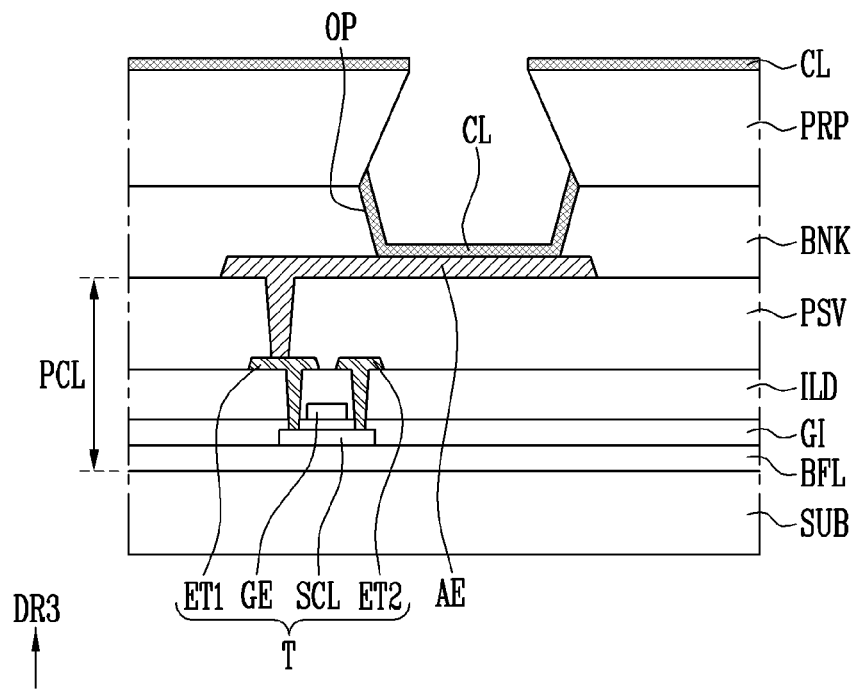
Figure 13E:
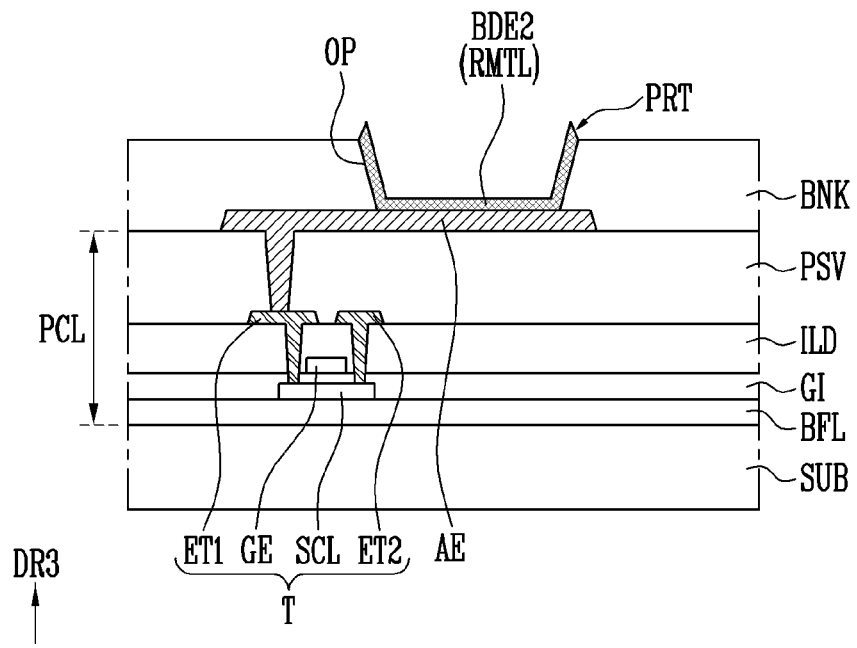
Figure 13F:
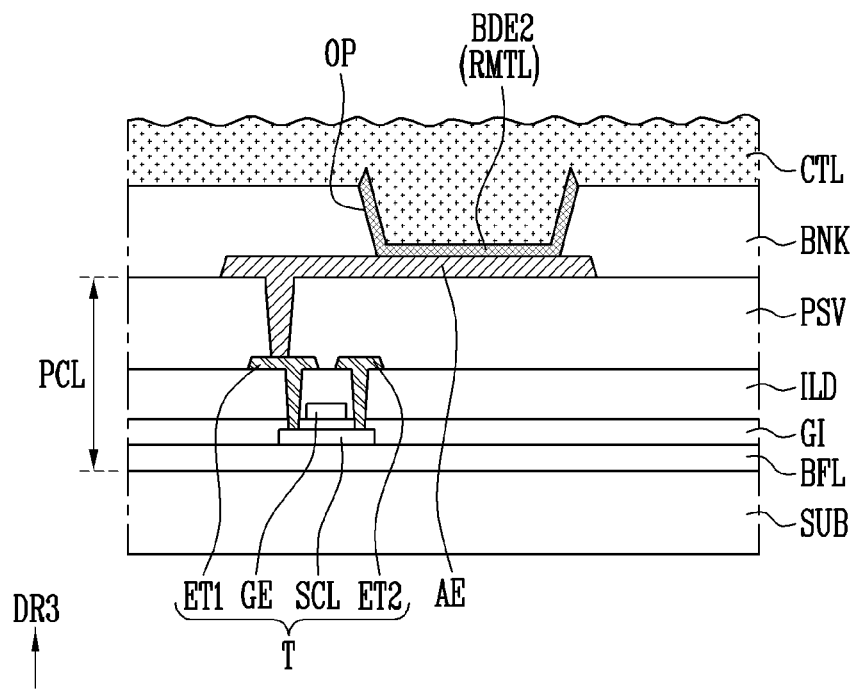
Figure 13G:
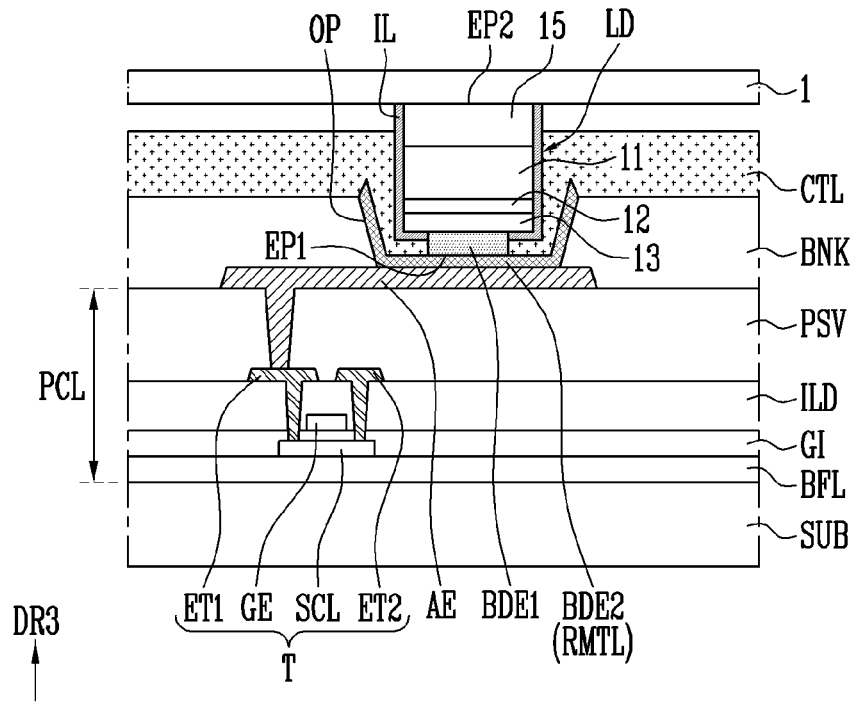
Figure 13H:
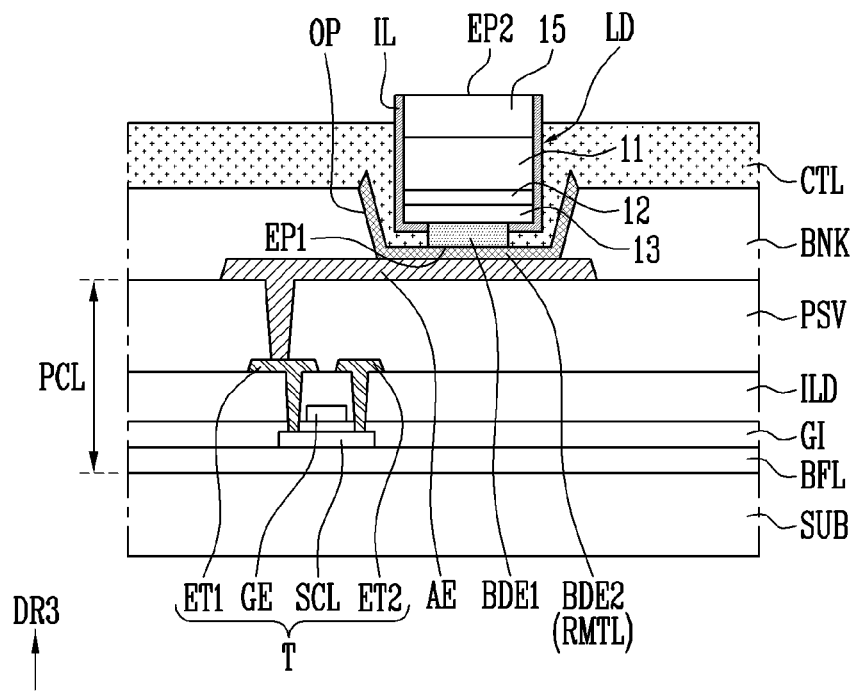

Referring to FIGS. 8, 13A, and 13B, after a mask (not illustrated) is disposed on the photosensitive material layer PR, a series of processes such as exposure and development are performed to form a photosensitive pattern PRP exposing a portion of the insulating material layer PDL', which does not transmit light, through the mask.

The exposed portion of the insulating material layer PDL' may correspond to areas of the first electrode AE.

Referring to FIGS. 8 and 13A to 13C, an etching process using the photosensitive pattern PRP as an etching mask is performed to remove a portion of the insulating material layer PDL' and form a bank BNK including an opening OP. The etching process may be performed using dry etching.

Due to the above-described process, a portion of the first electrode AE corresponding to the opening OP of the bank BNK may be exposed. Due to the above-described process, the photosensitive pattern PRP may be partially etched in a third direction DR3.

Referring to FIGS. 8 and 13A to 13D, a conductive layer CL is entirely formed on the photosensitive pattern PRP, the exposed first electrode AE, and the bank BNK through an E-beam evaporation method.

Referring to FIGS. 8 and 13A to 13E, a lift-off process is performed to remove the photosensitive pattern PRP and the conductive layer CL positioned thereon such that only the conductive layer CL positioned in the opening OP remains. The conductive layer CL positioned in the opening OP may become a conductive pattern BDE2 (or a second bonding electrode) which is positioned on a side surface of the bank BNK so as to surround the opening OP and concurrently is positioned on the exposed first electrode AE.

Both end portions of the conductive pattern BDE2 may extend to an upper surface of the bank BNK along the side surface of the bank BNK through the above-described lift-off process. The conductive pattern BDE2 may include a protrusion PRT protruding upward from the upper surface of the bank BNK.

Referring to FIGS. 8 and 13A to 13F, an intermediate layer CTL may be entirely applied on the conductive pattern BDE2 and the bank BNK and through a spin coating method.

The intermediate layer CTL may be entirely applied on the conductive pattern BDE2 and the bank BNK in the form of fluidity liquid form having viscosity. The intermediate layer CTL may be made of an organic material that may be transparent and has adhesion (or adhesiveness), may be cured by heat and/or light in a bonding process between the conductive pattern BDE2 and a light-emitting element LD to stably fix the light-emitting element LD, and may reduce a step difference due to components positioned thereunder such that a second electrode CE to be formed thereon has a flat surface.

In case that the above-described intermediate layer CTL is provided in the form of liquid, while the intermediate layer CTL is spontaneously moved (or pushed) by the light-emitting element LD to be transferred in the opening OP of the bank BNK during a subsequent process (transfer process of the light-emitting element LD), the conductive pattern BDE2 positioned thereunder may be exposed to the outside, and thus, the light-emitting element LD may come into contact with the exposed conductive pattern BDE2. The position of the light-emitting element LD may be temporarily fixed on the conductive pattern BDE2. The intermediate layer CTL may be cured by heat or pressure applied in a bonding process performed after the transfer process of the light-emitting element LD to stably fix the light-emitting element LD. A detailed description thereof will be described below with reference to FIG. 13G.

Referring to FIGS. 8 and 13A to 13G, a transfer substrate 1 onto which the light-emitting element LD is transferred is disposed at a preset position in the pixel PXL. As an example, the transfer substrate 1 onto which the light-emitting element LD is transferred is disposed in the pixel PXL such that a bonding electrode BDE1 of the light-emitting element LD is in contact with the conductive pattern BDE2. As an example, the light-emitting element LD transferred onto the transfer substrate 1 may be positioned in the opening OP. A third semiconductor layer 15 of the light-emitting element LD may be attached in contact with the transfer substrate 1, and the bonding electrode BDE1 of the light-emitting element LD may be in contact with the conductive pattern BDE2.

The transfer substrate 1 may be a translucent substrate including sapphire ($Al_2O_3$), glass, polyimide, or the like within the spirit and the scope of the disclosure. Accordingly, the transfer substrate 1 may transmit the laser light irradiated from above or below. A sacrificial layer (not illustrated) may be provided on the transfer substrate 1. The light-emitting element LD may be formed on the sacrificial layer on the transfer substrate 1. The sacrificial layer may include at least one selected from materials that may be readily delaminated by an irradiated laser from among materials having adhesion (or adhesiveness). In case that a laser is irradiated onto the transfer substrate 1, the sacrificial layer and the light-emitting element LD may be physically separated. For an example, the sacrificial layer may lose an adhesion function in case that a laser is irradiated.

A bonding process is performed using a bonding method including heating and pressurization to bond the bonding electrode BDE1 of the light-emitting element LD, thereby electrically connecting the first electrode AE and the light-emitting element LD.

During the above-described bonding process, the intermediate layer CTL may be cured to stably fix the light-emitting element LD bonded to the first electrode AE. A thickness (or a height) of the intermediate layer CTL may be less than a length L of the light-emitting element LD.

Referring to FIGS. 8 and 13A to 13H, after the bonding process, a laser is irradiated onto the transfer substrate 1 to separate the transfer substrate 1 from the light-emitting element LD, thereby exposing the third semiconductor layer 15 of the light-emitting element LD to the outside.

After the above-described process, the second electrode CE may be entirely formed on the third semiconductor layer 15 of the light-emitting element LD and the intermediate layer CTL. The second electrode CE may be in contact with and electrically connected to the third semiconductor layer 15. A contact structure between the second electrode CE and a first semiconductor layer 11 of the light-emitting element LD is not limited to the above-described embodiment. According to embodiments, the second electrode CE may be formed through the same process as the first semiconductor layer 11 of the light-emitting element LD and may be electrically connected to a common electrode (not illustrated) positioned in a non-display area NDA.

In a display device formed through the above-described manufacturing methods, the conductive pattern BDE2 bonding the light-emitting element LD and the first electrode AE is used as a reflective member RMTL to omit a process of forming a separate reflective member, thereby simplifying manufacturing processes. The conductive pattern BDE2 is disposed to surround the opening OP along a side surface of the bank BNK to allow the conductive pattern BDE2 to face an active layer 12 of the light-emitting element LD, thereby guiding light emitted from the light-emitting element LD in an image display direction to further improve the luminous efficiency of the pixel PXL.

Figure 14A:
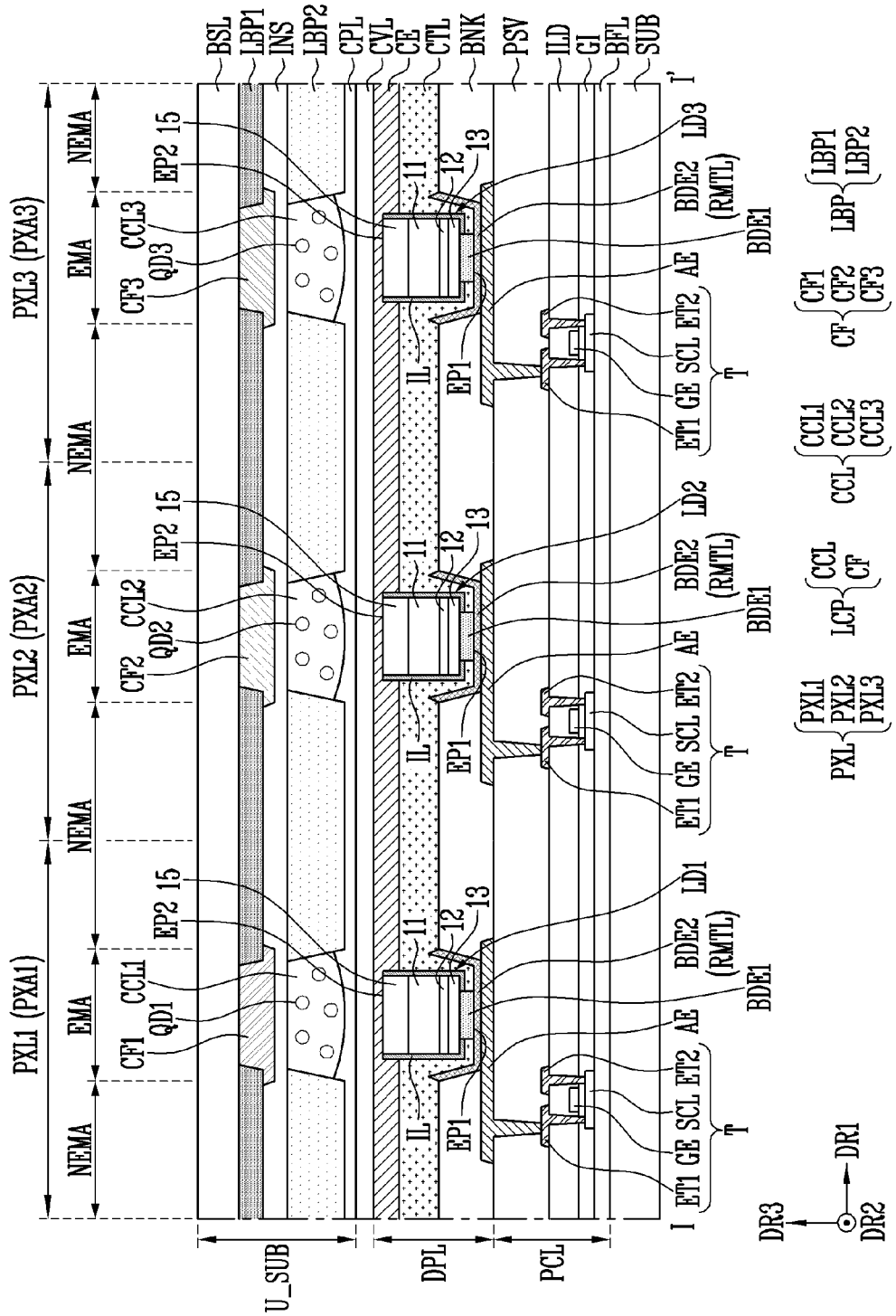
FIG. 14A is a schematic cross-sectional view taken along line I-I' of FIG. 3.

FIG. 14A is a schematic cross-sectional view taken along line I-I' of FIG. 3.

In order to avoid redundant descriptions with respect to first to third pixels PXL1 to PXL3 of FIG. 14A, differences from the above-described an embodiment will be described. Portions that may not be described in an embodiment follow those of the above-described embodiment. Identical reference numerals refer to identical components, and similar reference numerals refer to similar components.

In FIGS. 3 and 14A, only a partial configuration of each of the first to third pixels PXL1 to PXL3 is illustrated for convenience.

Referring to FIGS. 3 and 14A, a first pixel PXL1 (or a first subpixel), a second pixel PXL2 (or a second subpixel), and a third pixel PXL3 (or a third subpixel) may be arranged or disposed in a first direction DR1. Each of the first to third pixels PXL1, PXL2, and PXL3 may have the same configuration as the pixel PXL described with reference to FIGS. 8 and 12.

A display area DA of a substrate SUB may include a first pixel area PXA1 in which the first pixel PXL1 is provided, a second pixel area PXA2 in which the second pixel PXL2 is provided, and a third pixel area PXA3 in which the third pixel PXL3 is provided. In an embodiment, the first pixel PXL1 may be a red pixel, the second pixel PXL2 may be a green pixel, and the third pixel PXL3 may be a blue pixel. However, the disclosure is not limited thereto, and according to embodiments, the second pixel PXL2 may be a red pixel, the first pixel PXL1 may be a green pixel, and the third pixel PXL3 may be a blue pixel. According to an embodiment, the third pixel PXL3 may be a red pixel, the first pixel PXL1 may be a green pixel, and the second pixel PXL2 may be a blue pixel.

Each of the first, second, and third pixels PXL1, PXL2, and PXL3 may include an emission area EMA. Each of the first, second, and third pixels PXL1, PXL2, and PXL3 may include a non-emission area NEMA adjacent to the emission area EMA of a corresponding pixel PXL. A bank BNK (or a partition wall) may be positioned in the non-emission area NEMA.

Each of the first, second, and third pixels PXL1, PXL2, and PXL3 may include a substrate SUB, a pixel circuit layer PCL, and a display element layer DPL.

The display element layer DPL of the first pixel PXL1 may include a first electrode AE, a conductive pattern BDE2, the bank BNK, a first light-emitting element LD1, an intermediate layer CTL, and a second electrode CE. Each of the bank BNK, the intermediate layer CTL, and the second electrode CE may be commonly provided to the first, second, and third pixels PXL1, PXL2, and PXL3. For example, each of the bank BNK, the intermediate layer CTL, and the second electrode CE may be a common layer (film) provided to adjacent pixels PXL.

The conductive pattern BDE2 may be bonded to a bonding electrode BDE1 of the first light-emitting element LD1 to electrically connect the first light-emitting element LD1 and the first electrode AE. The conductive pattern BDE2 is positioned on each of a side surface of the bank BNK and the first electrode AE so as to surround an opening OP of the bank BNK, thereby guiding light emitted from the first light-emitting element LD1 in an image display direction to improve the luminous efficiency of the first pixel PXL1. During a bonding process between the first electrode AE and the first light-emitting element LD1, the intermediate layer CTL may be cured. The first light-emitting element LD1 may be stably fixed to be more securely, electrically, and/or physically connected to the first electrode AE. The intermediate layer CTL may have a thickness (or height) to such an extent as to expose a third semiconductor layer 15 of the first light-emitting element LD1 to the outside in order for a second end portion EP2 of the first light-emitting element LD1 to be electrically connected to the second electrode CE. As an example, the intermediate layer CTL may have a thickness (or a height) less than a length of the first light-emitting element LD1 in a third direction DR3.

In the above-described embodiment, one first light-emitting element LD1 may be bonded to the first electrode AE in the first pixel PXL1. Accordingly, one first light-emitting element LD1 may be provided in the first pixel PXL1.

An upper substrate U_SUB may be positioned on the display element layer DPL of the first pixel PXL1. The upper substrate U_SUB may include a light conversion pattern LCP, a light blocking pattern LBP, and a base layer BSL. The light conversion pattern LCP may include a first color filter CF1 positioned on one surface or a surface of the base layer BSL and a first color conversion pattern CCL1 positioned on the first color filter CF1 with an insulating layer INS interposed therebetween. Here, the first color conversion layer CCL1 may include first color conversion particles QD1. The first color filter CF1 may be a red color filter. The first color filter CF1 and the first color conversion layer CCL1 described above may be positioned in the emission area EMA of the first pixel PXL1.

The display element layer DPL of the second pixel PXL2 may include the first electrode AE, a conductive pattern BDE2, the bank BNK, a second light-emitting element LD2, the intermediate layer CTL, and the second electrode CE.

The conductive pattern BDE2 may be bonded to a bonding electrode BDE1 of the second light-emitting element LD2 to electrically connect the second light-emitting element LD2 and the first electrode AE. The second bonding electrode BDE2 is positioned on each of the side surface of the bank BNK and the first electrode AE so as to surround the opening OP of the bank BNK, thereby guiding light emitted from the second light-emitting element LD2 in the image display direction to improve the luminous efficiency of the second pixel PXL2.

The upper substrate U_SUB may be positioned on the display element layer DPL of the second pixel PXL2. The upper substrate U_SUB may include the light conversion pattern LCP, the light blocking pattern LBP, and the base layer BSL. The light conversion pattern LCP may include a second color filter CF2 positioned on one surface or a surface of the base layer BSL and a second color conversion pattern CCL2 positioned on the second color filter CF1 with the insulating layer INS interposed therebetween. The second color conversion layer CCL2 may include second color conversion particles QD2. The second color filter CF2 may be a green color filter.

The second color filter CF2 and the second color conversion layer CCL2 described above may be positioned in the emission area EMA of the second pixel PXL2. In the second pixel PXL2, one second light-emitting element LD2 may be bonded to the first electrode AE. Accordingly, one second light-emitting element LD2 may be provided in the second pixel PXL2.

The display element layer DPL of the third pixel PXL3 may include the first electrode AE, a conductive pattern BDE2, the bank BNK, a third light-emitting element LD3, the intermediate layer CTL, and the second electrode CE.

The conductive pattern BDE2 may be bonded to a bonding electrode BDE1 of the third light-emitting element LD2 to electrically connect the third light-emitting element LD3 and the first electrode AE. The conductive pattern BDE2 is positioned on each of the side surface of the bank BNK and the first electrode AE so as to surround the opening OP of the bank BNK, thereby guiding light emitted from the third light-emitting element LD3 in the image display direction, thereby improving the luminous efficiency of the third pixel PXL3.

The upper substrate U_SUB may be positioned on the display element layer DPL of the third pixel PXL3. The upper substrate U_SUB may include the light conversion pattern LCP, the light blocking pattern LBP, and the base layer BSL. The light conversion pattern LCP may include a third color filter CF3 positioned on one surface or a surface of the base layer BSL and a third color conversion pattern CCL3 positioned on the third color filter CF3 with an insulating layer INS interposed therebetween. The third color conversion layer CCL3 may include third color conversion particles QD3. The third color filter CF3 may be a green color filter. The third color filter CF3 and the third color conversion layer CCL3 described above may be positioned in the emission area EMA of the third pixel PXL3.

In the third pixel PXL3, one third light-emitting element LD3 may be bonded to the first electrode AE. Accordingly, one third light-emitting element LD3 may be provided in the third pixel PXL3.

A light blocking pattern LBP may be positioned in the non-emission area NEMA of each of the first, second, and third pixels PXL1, PXL2, and PXL3. The light blocking pattern LBP may include a first light blocking pattern LBP1 and a second light blocking pattern LBP2. The first light blocking pattern LBP1 may be positioned on one surface or a surface of the base layer BSL so as to be adjacent to the color filter CF of each of the first, second, and third pixels PXL1, PXL2, and PXL3. As an example, the first light blocking pattern LBP1 may be formed between the first color filter CF1 and the second color filter CF2 and between the second color filter CF2 and the third color filter CF3 on one surface or a surface of the base layer BSL. The second light blocking pattern LBP2 may be positioned on one surface or a surface of the insulating layer INS so as to be adjacent to the color conversion layer CCL of each of the first, second, and third pixels PXL1, PXL2, and PXL3. As an example, the second light blocking pattern LBP2 may be positioned between the first color conversion layer CCL1 and the second color conversion layer CCL2 and between the second color conversion layer CCL2 and the third color conversion layer CCL3 on one surface or a surface of the insulating layer INS.

Figure 14B:
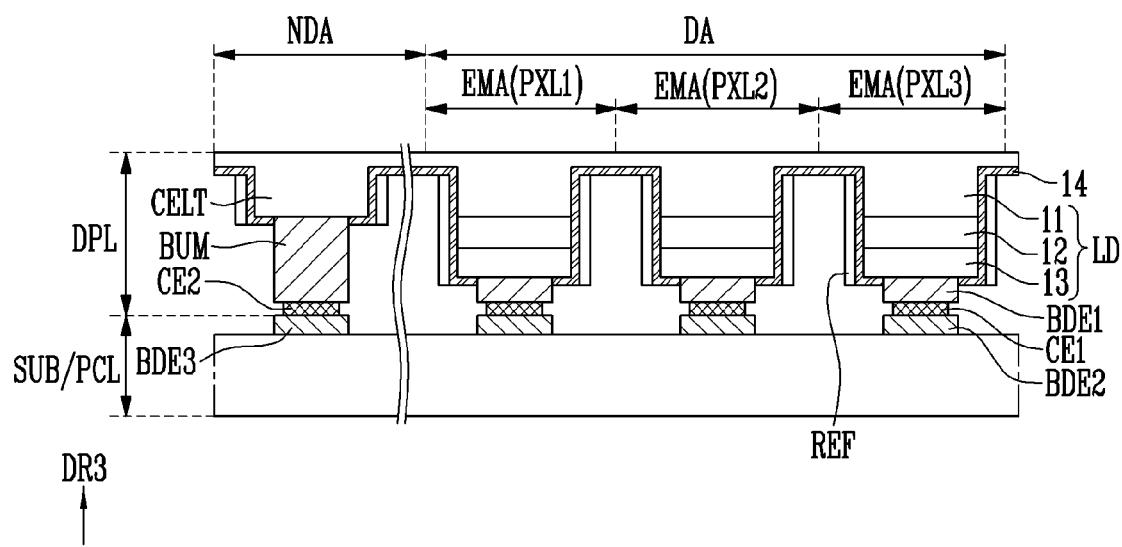
FIG. 14B is a schematic cross-sectional view illustrating a display device according to an embodiment.

FIG. 14B is a schematic cross-sectional view illustrating a display device according to an embodiment.

In order to avoid redundant descriptions with respect to first to third pixels PXL1 to PXL3 of FIG. 14B, differences from the above-described an embodiment will be described. Portions not particularly described in an embodiment follow those of the above-described an embodiment. In addition, identical reference numerals refer to identical components, and similar reference numerals refer to similar components.

In FIG. 14B, only a partial configuration of each of the first to third pixels PXL1 to PXL3 is illustrated for convenience.

Referring to FIGS. 3 and 14B, the first pixel PXL1 (or a first subpixel), the second pixel PXL2 (or a second subpixel), and the third pixel PXL3 (or a third subpixel) may be arranged or disposed in a one direction or in a direction in a display area DA. Each of the first to third pixels PXL1, PXL2, and PXL3 may have a configuration substantially similar to that of the pixel PXL described with reference to FIGS. 8 to 12.

Each of the first, second, and third pixels PXL1, PXL2, and PXL3 may include an emission area EMA.

Each of the first, second, and third pixels PXL1, PXL2, and PXL3 may include a substrate SUB, a pixel circuit layer PCL, and a display element layer DPL.

The pixel circuit layer PCL of each of the first, second, and third pixels PXL1, PXL2, and PXL3 may include a second conductive pattern BDE2 provided on the substrate SUB. Since the second conductive pattern BDE2 has the same configuration as the conductive pattern BDE2 described with reference to FIGS. 8 to 14A, a detailed description thereof will be omitted.

A third conductive pattern BDE3 may be provided and/or formed in a non-display area NDA. The third conductive pattern BDE3 may be electrically connected to a common electrode CELT. The third conductive pattern BDE3 may be electrically connected to the common electrode CELT through a bump BUM and a second conductive connector CE2. In an embodiment, the second conductive pattern BDE2 and the third conductive pattern BDE3 may be formed through the same process. Here, the bump BUM and the second conductive connector CE2 may be positioned in the non-display area NDA.

The display element layer DPL of each of the first, second, and third pixels PXL1, PXL2, and PXL3 may include a first conductive connector CE1 and a light-emitting element LD.

The first conductive connector CE1 may include a conductive material. The first conductive connector CE1 may be a connection member which connects or couples the separately provided second conductive pattern BDE2 and a bonding electrode BDE1 of the light-emitting element LD. According to embodiments, the first conductive connector CE1 may include an intermetallic compound generated and grown in a bonding process between the light-emitting element LD and the second conductive pattern BDE2, but the disclosure is not limited thereto.

The bonding electrode BDE1 of the light-emitting element LD may be a component for electrically connects the light-emitting element LD provided in the form of a chip to the pixel circuit layer PCL of each of the first, second, and third pixels PXL1, PXL2, and PXL3. The bonding electrode BDE1 of the light-emitting element LD may have the same configuration as the bonding electrode BDE1 of the light-emitting element LD described with reference to FIGS. 8 to 14A.

The light-emitting element LD may include a first semiconductor layer 11, an active layer 12, and a second semiconductor layer 13. The light-emitting element LD may have a substantially pillar shape, but the disclosure is not limited thereto. The light-emitting element LD may further include an insulating film 14 surrounding outer peripheral surfaces of the first semiconductor layer 11, the active layer 12, and the second semiconductor layer 13. The insulating film 14 may have the same configuration as the insulating film IL described with reference to FIGS. 8 to 14A.

The first semiconductor layer 11 may be electrically connected to the common electrode CELT formed in the non-display area NDA. The first semiconductor layer 11 may receive an electrical signal applied from the third conductive pattern BDE3 through the common electrode CELT. In an embodiment, the common electrode CELT may be formed through the same process as the first semiconductor layer 11.

In an embodiment, the first semiconductor layer 11 of the light-emitting element LD disposed in the first pixel PXL1, the first semiconductor layer 11 of the light-emitting element LD disposed in the second pixel PXL2, and the first semiconductor layer 11 of the light-emitting element LD disposed in the third pixel PXL3 may be connected to the common electrode CELT.

In an embodiment, the display element layer DPL may further include a reflective partition wall REF. The reflective partition wall REF may be disposed on an outer peripheral surface of the light-emitting element LD. The reflective partition wall REF may be disposed on the insulating film 14 formed on the outer peripheral surface of the light-emitting element LD. The reflective partition wall REF may include a reflective material.

In case that the display device according to the above-described embodiment is an electronic device, in which a display surface is applied to at least one surface or a surface thereof, such as a smartphone, a television, a tablet personal computer (PC), a mobile phone, an image phone, an e-book reader, a desktop PC, a laptop PC, a netbook computer, a workstation, a server, a personal digital assistant (PDA), a portable multimedia player (PMP), an MP3 player, a medical device, a camera, or a wearable device, the disclosure may be applied.

Hereinafter, an application field of the display device DD (see FIG. 1) in accordance with an embodiment will be described with reference to FIGS. 15 to 18.

FIGS. 15 to 18 are views illustrating application examples of display devices according to embodiments.

Figure 15:
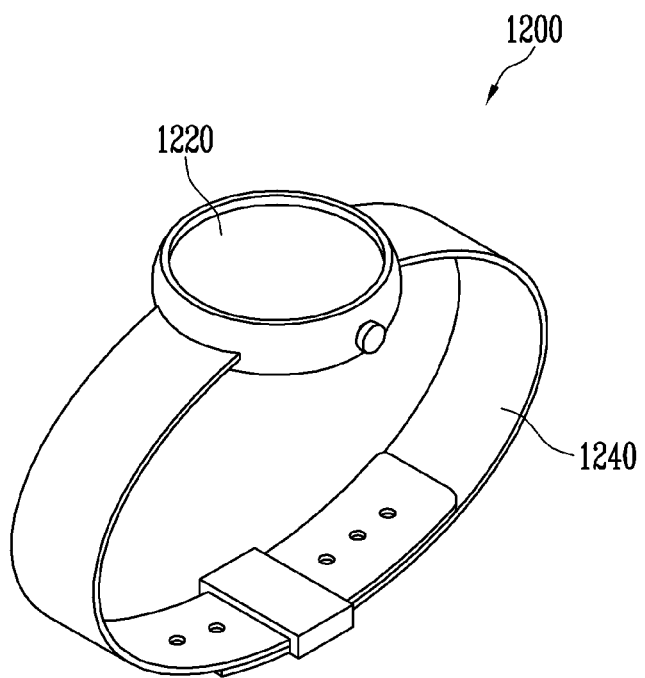
FIGS. 15 to 18 are views illustrating application examples of display devices in accordance with an embodiment.

First, referring to FIGS. 1 and 15, a display device DD may be applied to a smart watch 1200 including a display or a display unit 1220 and a strap or a strap unit 1240.

The smart watch 1200 may be a wearable electronic device and may have a structure in which the strap 1240 is mounted on a user's wrist. Here, the display device DD may be applied to the display unit 1220 to provide image data including time information to a user.

Figure 16:
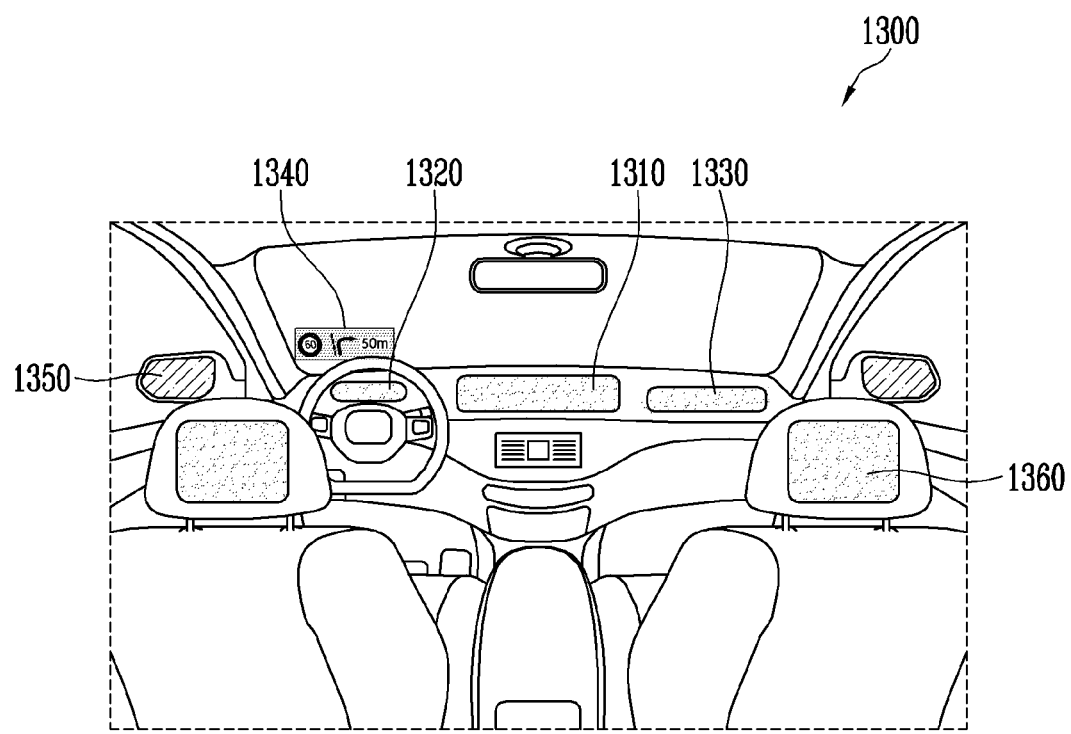
Figure 17:
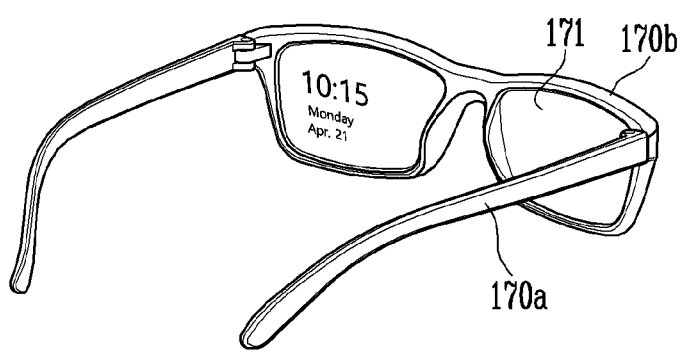

Referring to FIGS. 1 and 16, the display device DD may be applied to an automotive display 1300. Here, the automotive display 1300 may refer to an electronic device provided inside or outside a vehicle to provide image data.

For example, the display device DD may be applied to at least one of an infotainment panel 1310, a cluster 1320, a co-driver display 1330, a head-up display 1340, a head-up display 1340, a side mirror display 1350, and a rear-seat display 1360 which are provided in the vehicle.

Referring to 1 and 17, the display device DD may be applied to smart glasses including a frame 170 and a lens part 171. The smart glasses may be an wearable electronic device wearable on a user's face and may have a structure in which a portion of the frame 170 is folded or unfolded. For example, the smart glasses may be a wearable device for augmented reality (AR).

The frame 170 may include a housing 170b supporting the lens part 171 and a leg part 170a for wearing of a user. The leg part 170a is foldable or unfoldable by being connected to the housing 170b through a hinge.

A battery, a touch pad, a microphone, a camera, and the like may be embedded in the frame 170. A projector for outputting light, a processor for controlling an optical signal, and the like may be embedded in the frame 170.

The lens part 171 may be an optical member that transmits light or reflects light. The lens part 171 may include glass, a transparent synthetic resin, or the like within the spirit and the scope of the disclosure.

The lens part 171 reflects an image by an optical signal transmitted from a projector of the frame 170 through a rear surface of the lens part 171 (for example, a surface in a direction directed to user's eyes), thereby allowing the user's eyes to perceive the reflected image. For example, as illustrated in the drawing, a user may recognize information such as time and date displayed on the lens part 171. The lens part 171 may be a type of display device, and the display device DD may be applied to the lens part 171.

Figure 18:
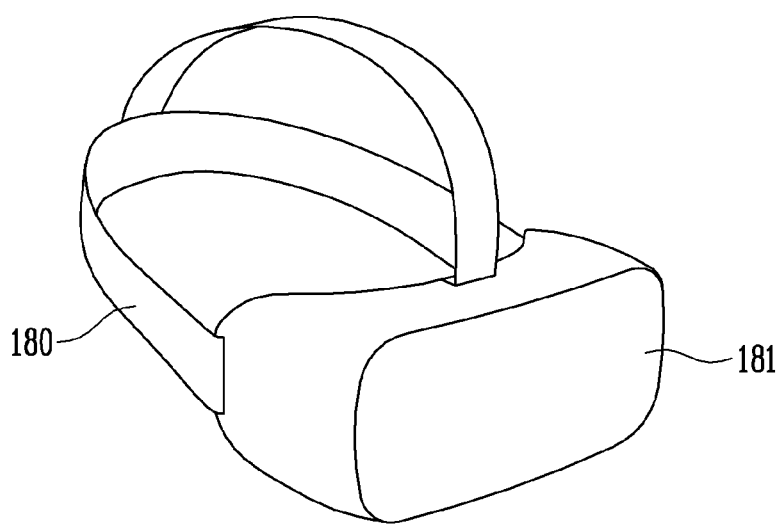

Referring to FIGS. 1 and 18, the display device DD may be applied to a head mounted display (HMD) including a head mounting band 180 and a display accommodation case 181. The HMD is a wearable electronic device wearable on a user's head.

The head mounting band 180 is a part which is connected to the display accommodation case 181 to fix the display accommodation case 181. In the drawing, the head mounting band 180 is illustrated as being able to surround an upper surface and both side surface of the user's head, but the disclosure is not limited thereto. The head mounting band 180 may be for fixing the HMD to the user's head and may be formed in the form of an eyeglass frame or a helmet.

The display accommodation case 181 may accommodate the display device DD and may include at least one lens. At least one lens is a part which provides an image to a user. For example, the display device DD may be applied to a left eye lens and a right eye lens implemented in the display accommodation case 181.

FIGS. 19 to 22 are schematic cross-sectional views illustrating pixels PXL according to an embodiment.

Figure 19:
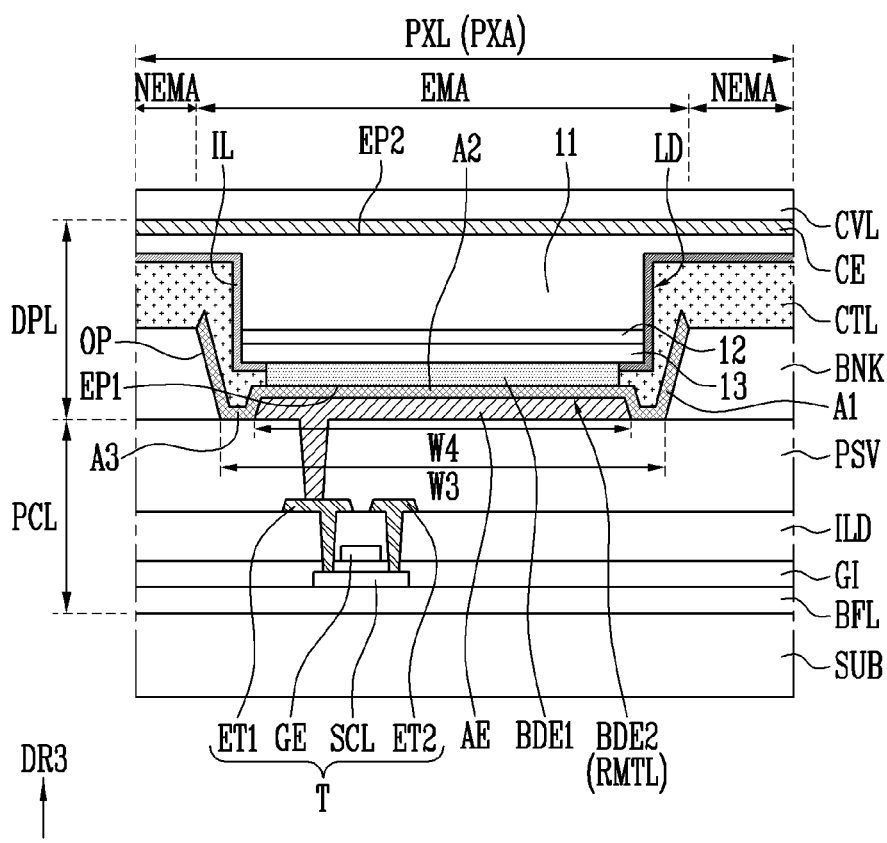
FIGS. 19 to 22 are schematic cross-sectional views illustrating pixels PXL according to an embodiment.
Figure 20:
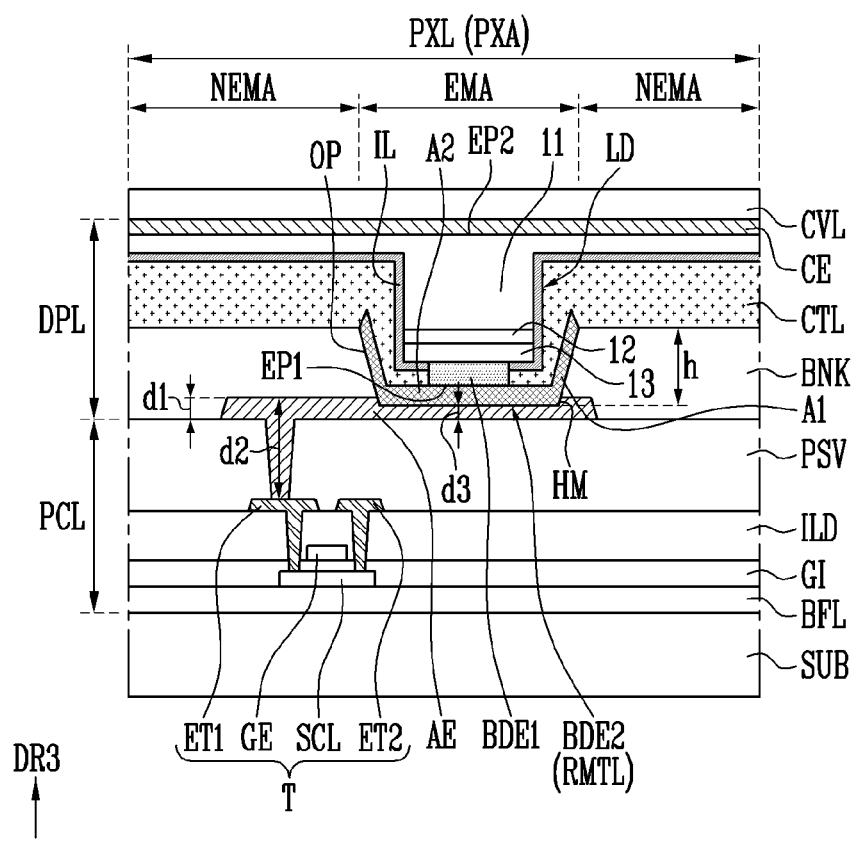
Figure 21:
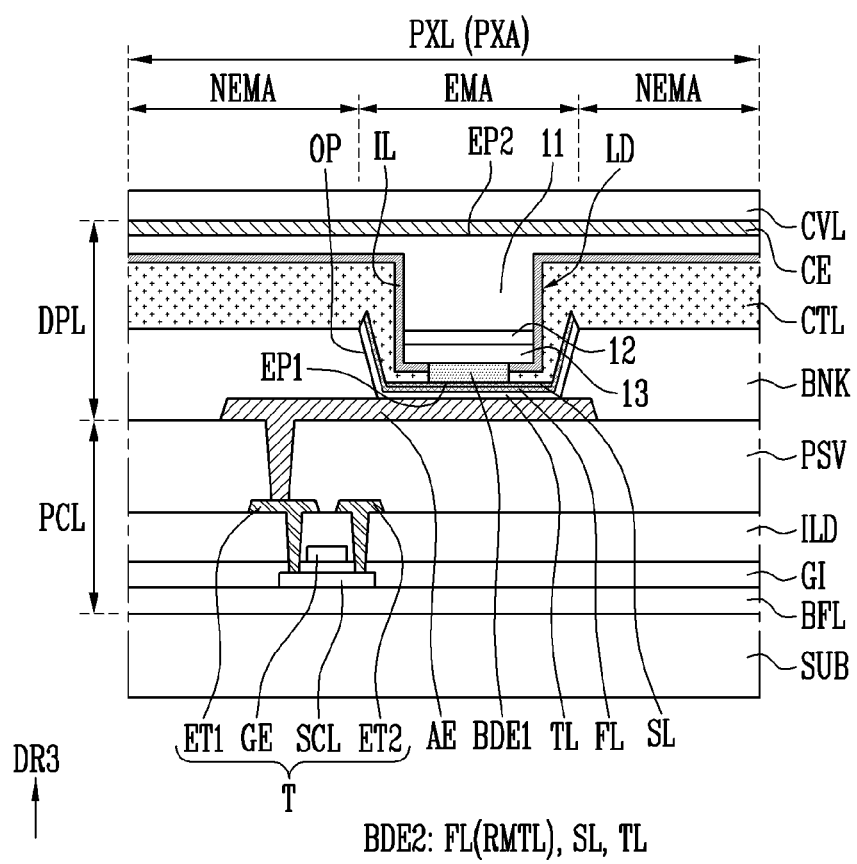
Figure 22:
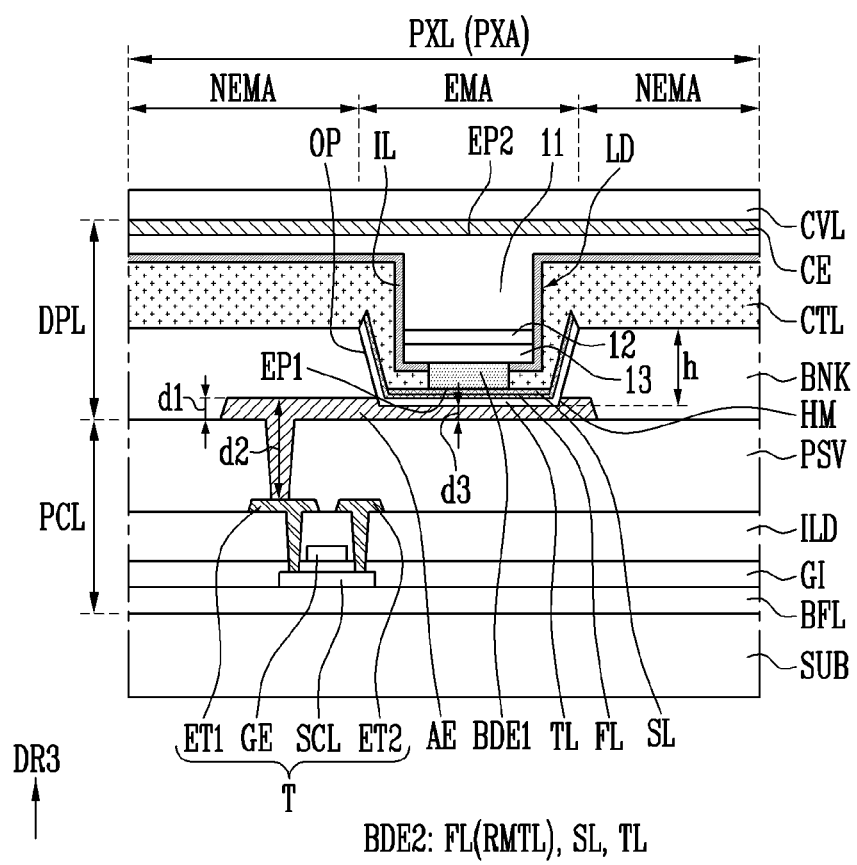

FIG. 19 illustrates a modified embodiment of the embodiment of FIG. 9 in relation to an opening OP of a bank BNK and the like, FIG. 20 illustrates a modified embodiment of the embodiment of FIG. 9 in relation to a first electrode AE and the like, and FIG. 21 illustrates a modified example of the embodiment of FIG. 9 in relation to a conductive pattern BDE2 and the like within the spirit and the scope of the disclosure. FIG. 22 illustrates a modified example of the embodiment of FIG. 21 in relation to the first electrode AE and the like within the spirit and the scope of the disclosure.

In FIGS. 19 to 22, differences from the above-described embodiment will be described in order to avoid redundant descriptions in FIGS. 19 to 22, a thickness direction of a substrate SUB on a cross-section is expressed as a third direction DR3.

Referring to FIGS. 1, 3, and 19, the pixel PXL may include the substrate SUB, a pixel circuit layer PCL, and a display element layer DPL.

The pixel circuit layer PCL may include the substrate SUB and one or more transistors T positioned on the substrate SUB. The transistor T may be a driving transistor T. Since the pixel circuit layer PCL is the same as the pixel circuit layer PCL described with reference to FIGS. 8 to 10C, a detailed description thereof will be omitted.

The display element layer DPL may include a first electrode AE, a bank BNK, a conductive pattern BDE2, an intermediate layer CTL, a light-emitting element LD, and a second electrode CE.

The first electrode AE may be electrically connected to a first terminal ET1 of the driving transistor T in the pixel circuit layer PCL.

The bank BNK may be positioned in a non-emission area NEMA to constitute a pixel definition film which partitions an emission area EMA of the pixel PXL. The bank BNK may include at least one light blocking material and/or a reflective material (or a scattering material) to prevent light leakage between adjacent pixels PXL. According to embodiments, the bank BNK may be an organic insulating film including an organic material.

The bank BNK may include an opening OP exposing the first electrode AE. As an example, the bank BNK may be partially opened to include the opening OP that entirely exposes the first electrode AE positioned on the pixel circuit layer PCL. The emission area EMA of the pixel PXL and the opening OP of the bank BNK may correspond to each other.

A width W3 of the opening OP of the bank BNK in one direction or a direction intersecting the third direction DR3 (for example, a lateral direction on the cross-section) is greater than a width W4 of the first electrode AE. Accordingly, one area or an area of a passivation layer PSV may be exposed. Here, the width W3 of the opening OP of the bank BNK may refer to a distance between two side surfaces of the bank BNK facing each other with the opening OP interposed therebetween.

A conductive pattern BDE2 (or a second bonding electrode) may be provided and/or formed in the opening OP of the bank BNK.

The conductive pattern BDE2 may be provided and/or formed on the side surface of the bank BNK, the exposed one area or an area of the passivation layer PSV, and the first electrode AE to surround the opening OP. The conductive pattern BDE2 may be a medium which is bonded to a bonding electrode BDE1 of the light-emitting element LD to electrically connect the driving transistor T and the light-emitting element LD. The conductive pattern BDE2 may be used as a reflective member RMTL which guide light emitted from the light-emitting element LD in an image display direction of a display device DD. To this end, the conductive pattern BDE2 may be made of an opaque conductive material having a reflectivity.

In an embodiment, the conductive pattern BDE2 may include a first portion A1, a second portion A2, and a third portion A3. As an example, the conductive pattern BDE2 may include the first portion A1 positioned on the side surface of the bank BNK, the second portion A2 positioned on the first electrode AE, and the third portion A3 positioned on the exposed passivation layer PSV.

The conductive pattern BDE2 may be entirely formed on the first electrode AE and may be formed on the exposed one area or an area of the passivation layer PSV due to the opening OP of the bank BNK having the width W3 that may be wider than that of the first electrode AE in one direction or a direction. An area of the conductive pattern BDE2 bonded to the light-emitting element LD may be increased.

In case that the area of the conductive pattern BDE2 is increased, and in case that the light-emitting element LD transferred onto a transfer substrate is re-transferred onto the first electrode AE in a transfer process performed before a bonding process (for example, a process of electrically connecting the light-emitting element LD and the first electrode AE), the light-emitting element LD may be readily (or sufficiently) inserted into the opening OP of the bank BNK. Accordingly, it is possible to prevent the misalignment of the light-emitting element LD that may occur in the above-described transfer process is prevented, thereby precisely aligning the light-emitting element LD at a desired position.

Referring to FIGS. 1, 3, and 20, the first electrode AE may include a groove HM corresponding to the opening OP of the bank BNK. The groove HM may be one area or an area of the first electrode AE positioned in the emission area EMA.

In an embodiment, the groove HM may be a stepped area from one surface (for example, an upper surface) or a surface of the first electrode AE toward the passivation layer PSV. The groove HM is a stepped area of the first electrode AE formed by forming the bank BNK including the opening OP on the first electrode AE and removing a portion of the first electrode AE exposed by the opening OP through an etching process. Accordingly, the first electrode AE including the groove HM may be thicker than the first electrode AE not including the groove HM.

Since the first electrode AE may include the groove HM in the emission area EMA, the opening OP may extend to the groove HM in the third direction DR3. Accordingly, a depth h of the opening OP of the bank BNK may be increased in the third direction DR3.

Because of the above-described groove HM, the first electrode AE may have at least two thicknesses in the third direction DR3. As an example, the first electrode AE has a first thickness d1 from one surface or a surface of the passivation layer PSV to an upper surface of the first electrode AE in the third direction DR3, a second thickness d2 from one surface or a surface of the first terminal ET1 of the driving transistor T to the upper surface of the first electrode AE, and a third thickness d3 from one surface or a surface of the passivation layer PSV to the groove HM. The first thickness d1, the second thickness d2, and the third thickness d3 may be different from each other. As an example, the second thickness d2 may be the thickest, and the third thickness d3 may be the thinnest.

The conductive pattern BDE2 may be provided and/or formed on the first electrode AE including the groove portion HM.

As described above, since the first electrode AE corresponding to the opening OP of the bank BNK may include the groove HM, the second portion A2 of the conductive pattern BDE2 positioned thereon may further obtain a thickness by as much as a thickness of the first electrode AE removed in the above-described etching process. Accordingly, the second portion A2 of the conductive pattern BDE2 positioned on the first electrode AE has a certain or given level or more of thickness to more stably and electrically connect the light-emitting element LD and the first electrode AE in a bonding process.

Since the depth h of the opening OP of the bank BNK is increased due to the groove HM of the first electrode AE, the light-emitting element LD may be more deeply inserted into the opening OP. Accordingly, since the first portion A1 of the conductive pattern BDE2 is positioned closer to an active layer 12 of the light-emitting element LD, an area of the conductive pattern BDE2 corresponding to the active layer 12 is further increased, thereby further guiding light emitted from the active layer 12 in a desired direction to further increase the luminous efficiency of the pixel PXL.

Referring to FIGS. 11, 3, and 21, the conductive pattern BDE2 may include a first layer FL, a second layer SL, and a third layer TL.

The third layer TL may be provided and/or formed on the side surface of the bank BNK and the first electrode AE in the opening OP of the bank BNK to surround the opening OP. The third layer TL may be positioned on the first electrode AE and the side surface of the bank BNK to be in contact with or in direct contact with the first electrode AE and a side surface of the bank BNK.

In an embodiment, the third layer TL may be a metal layer which is in contact with or in direct contact with the first electrode AE and electrically connected to the first electrode AE and may be made of at least one selected from titanium (Ti), copper (Cu), nickel (Ni), and the like within the spirit and the scope of the disclosure. The first layer FL may have a certain or given level or more of thickness in order to reduce a step difference between the first electrode AE and the light-emitting element LD. As an example, the third layer TL may be formed as a double-layer in which titanium (Ti) and copper (Cu) may be sequentially stacked each other, but the disclosure is not limited thereto. In case that the third layer TL is formed as a double-layer in which titanium (Ti) and copper (Cu) may be sequentially stacked each other, a thickness of copper (Cu) may be adjusted to secure the thickness of the third layer TL to a certain or given level or more. The third layer TL may have the same or substantially similar configuration to the first layer FL described with reference to FIGS. 10A to 10C.

The third layer TL may be a barrier metal layer for preventing diffusion that may occur in a process of forming the first layer FL positioned thereon.

The first layer FL may be positioned between the third layer TL and the second layer SL. The first layer FL may be made of a conductive material having reflectivity so as to guide light emitted from the light-emitting element LD in the image display direction (or a front direction) of the display device DD. The conductive material may include an opaque metal advantageous in reflecting light emitted from the light-emitting elements LD in the image display direction (or a desired direction) of the display device DD. The opaque metal may include, for example, a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), or an alloy thereof. As an example, the first layer FL may include aluminum (Al).

The second layer SL may be a metal layer which is in contact with or direct contact with the bonding electrode BDE1 of the light-emitting element LD and electrically connected to the light-emitting element LD. In case that the second layer SL is bonded to the bonding electrode BDE1 of the light-emitting element LD, the second layer SL may be made of at least one selected from gold (Au) and tin (Sn) having high bonding strength (or adhesive strength) in order to facilitate the formation and growth of an intermetallic compound between the second layer SL and the bonding electrode BDE1 of the light-emitting element LD. As an example, the second layer SL may include gold (Au). In an embodiment, the second layer SL may have the same or substantially similar configuration to the second layer SL described with reference to FIGS. 10A to 10C.

In the opening OP of the bank BNK, the second layer SL may not be disposed on the side surface of the bank BNK and may be disposed only on one surface or a surface of the first layer FL corresponding to the first electrode AE. Accordingly, on the side surface of the bank BNK, the first layer FL may be positioned on the uppermost layer.

In the conductive pattern BDE2 including a triple-layer in which the third layer TL, the first layer FL, and the second layer SL may be sequentially stacked from one surface or a surface of the first electrode AE, the first layer FL may be used as a reflective member RMTL which is positioned on the side surface of the bank BNK to guide light emitted from the light-emitting element LD toward the display device DD, and the second layer SL may be used as a bonding electrode which is positioned on the uppermost layer among the components positioned on the first electrode AE exposed in the opening OP of the bank BNK and may be connected to or connected directly and bonded to the bonding electrode BDE1 of the light-emitting element.

Referring to FIGS. 1, 3, and 22, the first electrode AE may include a groove HM corresponding to the opening OP of the bank BNK. The first electrode AE may have at least two thicknesses in the third direction DR3. As an example, the first electrode AE may have a first thickness d1, a second thickness d2, and a third thickness d3 different from each other in the third direction DR3. Since the first electrode AE is the same as the first electrode AE described with reference to FIG. 20, a detailed description thereof will be omitted.

Since the first electrode AE may include the groove HM in the emission area EMA, the opening OP of the bank BNK may extend to the groove HM in the third direction DR3. Accordingly, the depth h of the opening OP of the bank BNK may be increased in the third direction DR3.

The conductive pattern BDE2 may be provided and/or formed on the first electrode AE including the groove portion HM.

The conductive pattern BDE2 may be formed as a triple-layer in which a third layer TL, a first layer FL, and a second layer SL may be sequentially stacked each other on one surface or a surface of the first layer FL. Since the second conductive pattern BDE2 has the same configuration as the conductive pattern BDE2 described with reference to FIG. 21, a detailed description thereof will be omitted.

As described above, since the depth h of the opening OP of the bank BNK is increased due to the groove HM of the first electrode AE, the light-emitting element LD may be more deeply inserted into the opening OP. Accordingly, since the first portion A1 of the conductive pattern BDE2 positioned on the side surface of the bank BNK is positioned closer to the active layer 12 of the light-emitting element LD, an area of the first layer FL corresponding to the active layer 12 is further increased, thereby further guiding light emitted from the active layer 12 in a desired direction to further increase the luminous efficiency of the pixel PXL.

In accordance with the disclosure, the conductive pattern bonding to the light-emitting element and disposed on the first electrode (or "pixel electrode", "anode electrode") is used as the reflective member (or "guide member") which guide light emitted from the light-emitting element in the image display direction of the display device to omit a process of forming a separate reflective member, thereby simplifying manufacturing processes of the display device.

Also, in accordance with the disclosure, by disposing the conductive pattern between the light-emitting element and the first electrode, even light traveling downward of the light-emitting element may be guided in the image display direction. Accordingly, the display device having improved light output efficiency of each pixel and the method of manufacturing the same may be provided.

Although embodiments have been described, it is understood that the disclosure should not be limited to these embodiments but various changes and modifications may be made by one of ordinary skill in the art within the spirit and scope of the disclosure as hereinafter claimed.

Therefore, the scope is not limited to the embodiments described herein, but may be determined by claims.

What is claimed is:

1. A display device comprising: pixels disposed on a substrate, wherein each of the pixels includes: a pixel circuit layer disposed on the substrate and includes at least one transistor; a first electrode disposed on the pixel circuit layer and electrically connected to the at least one transistor; a bank disposed on the first electrode, the bank including an opening exposing the first electrode; a conductive pattern disposed on a side surface of the bank surrounding the opening of the bank and the exposed first electrode; a light-emitting element disposed on the conductive pattern in the opening of the bank and electrically connected to the first electrode; and a second electrode disposed on the light-emitting element, and the conductive pattern is a guide member that guides light emitted from the light-emitting element to an upper portion of the second electrode, wherein the first electrode includes a groove stepped from a surface of the first electrode toward the pixel circuit layer, and the groove corresponds to the opening of the bank.

2. The display device of claim 1, wherein
the light-emitting element includes a first end portion and a second end portion in a length direction of the light-emitting element,
the first end portion contacts and is electrically connected to the conductive pattern, and
the second end portion contacts and is electrically connected to the second electrode.

3. The display device of claim 2, wherein
the light-emitting element includes:
a bonding electrode disposed at the first end portion of the light-emitting element, the bonding electrode contacting and electrically connected to the conductive pattern;
a third semiconductor layer disposed at the second end portion of the light-emitting element, the third semiconductor layer contacting and electrically connected to the second electrode;
a second semiconductor layer disposed on the bonding electrode;
a first semiconductor layer disposed between the third semiconductor layer and the second semiconductor layer; and
an active layer disposed between the first semiconductor layer and the second semiconductor layer,
the first semiconductor layer is an n-type semiconductor layer doped with an n-type dopant, and
the second semiconductor layer is a p-type semiconductor layer doped with a p-type dopant.

4. The display device of claim 3, wherein the conductive pattern is bonded to the bonding electrode of the light-emitting element.

5. The display device of claim 4, wherein
the conductive pattern includes a first layer disposed on the first electrode and a second layer disposed on the first layer,
the first layer directly contacts the first electrode, and
the second layer directly contacts the bonding electrode.

6. The display device of claim 5, wherein each of the first layer and the second layer includes a metal that reflects a light emitted from the light-emitting element.

7. The display device of claim 6, wherein
the first layer includes at least one metal selected from gold and tin,
the second layer includes at least one metal selected from titanium, copper, and nickel, and
the first layer and the second layer have different thicknesses.

8. The display device of claim 2, wherein an area of the conductive pattern disposed on the side surface of the bank has a gradient corresponding to an inclination angle of the side surface of the bank.

9. The display device of claim 8, wherein the area of the conductive pattern includes a protrusion protruding toward the second electrode.

10. The display device of claim 2, wherein each of the pixels includes an intermediate layer disposed between the bank and the second electrode in the opening of the bank.

11. The display device of claim 10, wherein the intermediate layer is a fixing member fixing the light-emitting element, the intermediate layer including an organic material that has adhesiveness and is cured by heat or light.

12. The display device of claim 2, wherein
each of the pixels includes:
an emission area including the light-emitting element; and
a non-emission area adjacent to the emission area,
the bank corresponds to the non-emission area, and
the opening of the bank corresponds to the emission area.

13. The display device of claim 12, wherein each of the pixels includes:
a cover layer entirely disposed on the second electrode; and
an upper substrate disposed on the cover layer.

14. The display device of claim 13, wherein the upper substrate includes:
a base layer disposed on the cover layer including a surface facing the light-emitting element;
a light conversion pattern disposed on the surface of the base layer to correspond to the emission area; and
a light blocking pattern disposed on the surface of the base layer to correspond to the non-emission area.

15. The display device of claim 14, wherein the light conversion pattern includes:
a color filter disposed on the surface of the base layer; and
a color conversion layer disposed on the color filter with an insulating layer disposed between the color conversion layer and the color filter to correspond to the light-emitting element, and the color conversion layer including color conversion particles.

16. The display device of claim 15, wherein the light blocking pattern includes:
a first light blocking pattern disposed on the surface of the base layer; and
a second light blocking pattern disposed on the insulating layer to correspond to the first light blocking pattern.

17. The display device of claim 16, wherein the upper substrate includes a capping layer entirely disposed on the color conversion layer and the second light blocking pattern.

18. The display device of claim 1, wherein the opening of the bank has a width greater than a width of the first electrode.

19. The display device of claim 18, wherein
the pixel circuit layer includes a passivation layer disposed on the at least one transistor, and
the opening of the bank entirely exposes the first electrode and partially exposes the passivation layer.

20. The display device of claim 19, wherein the conductive pattern is disposed on the exposed first electrode and the exposed portion of the passivation layer.

21. The display device of claim 1, wherein the conductive pattern includes: a third layer disposed on the exposed first electrode and the side surface of the bank; a first layer disposed on the third layer; and a second layer disposed between the first layer and the light-emitting element, the third layer directly contacts the first electrode, and the second layer directly contacts the light-emitting element.

22. The display device of claim 21, wherein
the third layer includes at least one metal selected from titanium, copper, and nickel,
the first layer includes aluminum, and
the second layer includes at least one metal selected from gold and tin.

23. The display device of claim 22, wherein the first layer is disposed on an uppermost layer on the side surface of the bank.

24. A display device comprising: pixels disposed on a substrate, wherein each of the pixels includes: a pixel circuit layer disposed on the substrate, the pixel circuit layer including at least one transistor; a first electrode disposed on the pixel circuit layer and electrically connected to the at least one transistor; a bank disposed on the first electrode, the bank including an opening exposing the first electrode; a conductive pattern disposed on a side surface of the bank surrounding the opening and the exposed first electrode; a light-emitting element disposed on the conductive pattern in the opening and electrically connected to the first electrode; and a second electrode disposed on the light-emitting element, the conductive pattern includes a third layer disposed on the first electrode, a first layer disposed on the third layer, and a second layer disposed on the first layer on the first electrode, the conductive pattern is a guide member that guides light emitted from the light-emitting element to an upper portion of the second electrode, and the second layer is a bonding member bonded to the light-emitting element.

25. A method of manufacturing a display device, the method comprising:
forming at least one transistor on a substrate;
forming a first electrode electrically connected to the at least one transistor on the at least one transistor;
applying an insulating material layer and a photosensitive material layer on the first electrode and removing the photosensitive material layer on an area of the first electrode to form a photosensitive pattern exposing the insulating material layer;
removing the exposed insulating material layer using the photosensitive pattern as an etching mask to form a bank including an opening exposing the area of the first electrode;
forming a conductive layer entirely on the photosensitive pattern and the exposed area of the first electrode;

removing the photosensitive pattern and the conductive layer disposed on the photosensitive pattern through a lift-off to form a conductive pattern on the area of the first electrode;

applying, entirely, an intermediate layer material having fluidity on the conductive pattern and the bank;

disposing a transfer substrate, onto which at least one light-emitting element is transferred, on the substrate, bonding the light-emitting element and the conductive pattern, curing the intermediate layer material to form an intermediate layer, and then removing the transfer substrate; and forming a second electrode on the light-emitting element and the intermediate layer, wherein the conductive pattern is a guide member that guides light emitted from the light-emitting element to an upper portion of the second electrode.

26. The method of claim 25, wherein the light-emitting element includes:
- a bonding electrode that contacts the conductive pattern and is electrically connected to the conductive pattern;
- a third semiconductor layer that contacts the second electrode and is electrically connected to the second electrode;
- a second semiconductor layer disposed on the bonding electrode;
- a first semiconductor layer disposed between the third semiconductor layer and the second semiconductor layer; and
- an active layer disposed between the first semiconductor layer and the second semiconductor layer, the first semiconductor layer is an n-type semiconductor layer doped with an n-type dopant, and the second semiconductor layer is a p-type semiconductor layer doped with a p-type dopant.

27. The method of claim 26, wherein
the conductive pattern includes a first layer disposed on the first electrode and a second layer disposed on the first layer,
the first layer directly contacts the first electrode, and
the second layer directly contacts the bonding electrode.

* * * * *